United States Patent
Hayashida et al.

(10) Patent No.: US 11,031,561 B2
(45) Date of Patent: Jun. 8, 2021

(54) ORGANIC ELECTRON TRANSPORT MATERIAL AND ORGANIC ELECTROLUMINESCENT ELEMENT USING SAME

(71) Applicant: Dyden Corporation, Kurume (JP)

(72) Inventors: Tsuyoshi Hayashida, Kurume (JP); Masataka Watanabe, Kurume (JP); Masanobu Kotsubo, Kurume (JP); Izumi Maki, Kurume (JP); Mitsuharu Noto, Kurume (JP)

(73) Assignee: Dyden Corporation, Fukuoka (JP)

( * ) Notice: Subject to any disclaimer, the term of this patent is extended or adjusted under 35 U.S.C. 154(b) by 378 days.

(21) Appl. No.: 16/066,909

(22) PCT Filed: Nov. 16, 2016

(86) PCT No.: PCT/JP2016/084004
§ 371 (c)(1),
(2) Date: Jun. 28, 2018

(87) PCT Pub. No.: WO2017/115578
PCT Pub. Date: Jul. 6, 2017

(65) Prior Publication Data
US 2020/0168807 A1    May 28, 2020

(30) Foreign Application Priority Data
Dec. 28, 2015    (JP) .............................. JP2015-257138

(51) Int. Cl.
*H01L 51/50*    (2006.01)
*H01L 51/00*    (2006.01)

(52) U.S. Cl.
CPC ........ *H01L 51/0072* (2013.01); *H01L 51/006* (2013.01); *H01L 51/0054* (2013.01);
(Continued)

(58) Field of Classification Search
None
See application file for complete search history.

(56) References Cited

FOREIGN PATENT DOCUMENTS

| CN | 103183710 A | 7/2013 |
| CN | 109336834 A | * 3/2016 | ............. H01L 51/54 |

(Continued)

OTHER PUBLICATIONS

Granoth et. al., Studies in the phenoxaphosphine series , 1970 Tetrahedron 26(3), 813-16 (Year: 1970).*

(Continued)

*Primary Examiner* — Gregory D Clark
(74) *Attorney, Agent, or Firm* — K&L Gates LLP; Louis C. Cullman; Georgia N. Kefallinos

(57) ABSTRACT

An organic electron transport material, which includes a phosphine oxide derivative represented by the following Formula (1):

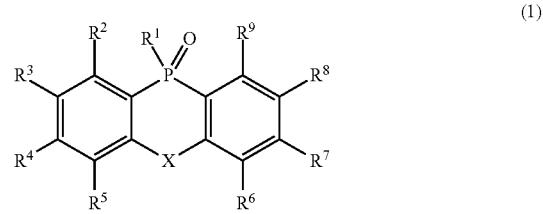

$R^1$ represents an atomic group which has either or both of one or more aryl groups and one or more heteroaryl groups and which may have one or more phosphine oxide group, and $R^2$ to $R^9$ each independently represent an atom or an atomic group selected from the group consisting of a hydrogen atom, a halogen atom, a cyano group, a $C_1$-$C_{12}$ linear or branched alkyl group, a linear or branched fluoroalkyl group, an aryl group, a substituted aryl group, a heteroaryl group, and a substituted heteroaryl group.

3 Claims, 1 Drawing Sheet

(52) U.S. Cl.
CPC ...... *H01L 51/0058* (2013.01); *H01L 51/0067* (2013.01); *H01L 51/0073* (2013.01); *H01L 51/5016* (2013.01); *H01L 51/5072* (2013.01); *H01L 51/5092* (2013.01)

(56) References Cited

FOREIGN PATENT DOCUMENTS

| | | |
|---|---|---|
| JP | 2008-545630 A | 12/2008 |
| JP | 2010-278376 | 12/2010 |
| JP | 2014-122218 | 7/2014 |
| WO | 2015/080182 A1 | 6/2015 |
| WO | 2016/109274 A1 | 7/2016 |
| WO | 2017/115578 A1 | 7/2017 |

OTHER PUBLICATIONS

Tang et al., Organic electroluminescent diodes. Appl. Phsy. Lett. 51(12), pp. 913-915 (1987).
Lin et al., Achilles heels of phosphine oxide materials for OLEDs: Chemical stability and degradation mechanism of a bipolar phosphine oxide/carbazole hybrid host material. J. Phys. Chem. C 116(36), pp. 19451-19457 (2012).
Suzuki et al., Organic syntheses via boranes: vol. 3 suzuki coupling. Aldrich Chemical Co., 314 pp., hard cover (2003).
International Search Report and Written Opinion for International Serial No. PCT/JP2016/084004 dated Feb. 14, 2017. (English translation of International Search Report enclosed).

\* cited by examiner

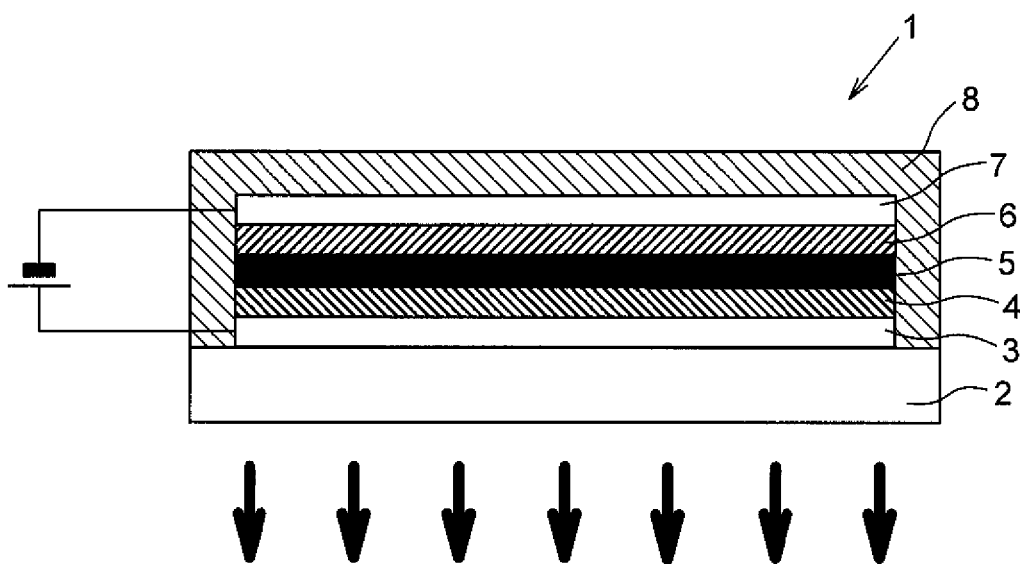

ORGANIC ELECTRON TRANSPORT MATERIAL AND ORGANIC ELECTROLUMINESCENT ELEMENT USING SAME

This application is a national phase entry of PCT/JP2016/084004, filed Nov. 16, 2016, which claims the benefit of Japanese Patent Application No. 2015-257138, filed Dec. 28, 2015, the entire disclosures each of which is incorporated herein by reference.

TECHNICAL FIELD

The present disclosure relates to an organic electron transport material that has improved degradation stability and an organic electroluminescent element using the same.

BACKGROUND ART

Organic electroluminescence (EL) elements, in which a luminescent organic compound layer (organic electroluminescence layer) is provided between a positive electrode and a negative electrode, (hereinafter referred to as "organic EL elements") are more advantageous than inorganic EL elements in that organic EL elements can be driven at low DC voltages and they have high brightness and luminescent efficiency. Therefore, the organic EL elements have been gaining attention as next-generation display devices. Recently, a full-color display panels are commercially available. Research and development have been actively made for an increase in the size of display screen, improvement of durability, and the like.

The organic EL element is an electroluminescence element in which an organic compound is electrically excited by recombination of the injected electrons and holes (positive holes) such that light emission is induced. Many companies and research institutes have been studying organic EL elements since Tang et al. from Kodak reported that an organic layered thin film element emits light with brightness (see Non Patent Literature 1). The representative configuration of the organic EL element according to Kodak was made by sequentially layering a diamine compound serving as a hole transporting material, tris(8-quinolinolato) aluminum (III) serving as a luminescent material, a cathode Mg:Al serving as a negative electrode on an ITO (indium tin oxide) glass substrate serving as a transparent positive electrode. Green light emission with a brightness of 1000 cd/cm$^2$ was observed at about 10V driving voltage. Basically, layered-type organic EL elements under current study or in practical use follow the configuration of the Kodak.

Organic EL elements are roughly divided by their constituent materials into polymer organic EL elements and the low-molecular organic EL elements. The former is produced by a wet method, and the latter is produced by a wet method or a dry method such as a vapor deposition method. For polymer organic EL elements, it is difficult to balance hole transport properties and electron transport properties of a conductive polymer material used for manufacturing of the elements. Therefore, in recent years, layered-type low-molecular organic EL elements in which the functions of electron transport, hole transport, and luminescence are separated are becoming the mainstream.

In the wet method, in which manufacturing is carried out using a printing technique such as an inkjet method, since it is possible to coat a large area at a time, even an element having a large screen can be easily produced with high productivity. Therefore, the method is expected to be used as a next-generation organic EL element manufacturing method that can replace the dry method. Methods of manufacturing layered-type low-molecular organic EL elements based on the wet method are roughly divided into two types. One is a method comprising conducting crosslinking or polymerization for insolubilization by heat or light after film formation of a lower layer, thereby conducting film formation of an upper layer. The other one is a method comprising using materials having significantly different solubilities for a lower layer and an upper layer. In the former method, although the selection of materials is wide, it is difficult to remove the reaction initiator and unreacted substances after crosslinking or polymerization, which is problematic in terms of durability. In the latter method, although the selection of materials is difficult, it is possible to construct a highly durable element with high purity because no chemical reaction is required as compared with the method involving insolubilization. In view of such a risk of chemical reaction, a suitable mode of layering by the wet method is considered to be layering based on the difference in solubility, although the selection of material is difficult. However, one of the factors that make it difficult to conduct layering utilizing the difference in solubility is the fact that most of conductive polymers and spin-coatable organic semiconductors are soluble only in solvents having relatively high levels of solvent power such as high toluene, chloroform, and tetrahydrofuran. In most cases, layered-type organic EL elements are manufactured by sequentially layering a hole transport layer comprising a P-type organic semiconductor, a light emitting layer, an electron transport layer comprising an N-type organic semiconductor on a positive electrode comprising a transparent metal oxide such as ITO. In this case, after the film formation of the hole transport layer with a P-type organic semiconductor polymer, an N-type organic semiconductor polymer is spin-coated using the same solvent. This causes the hole transport layer to be eroded, thereby making it impossible to form a flat layered structure having a PN interface with fewer defects. This is problematic. In particular, in the case of using an inkjet method, since the solvent is removed by natural drying, erosion of a hole transport layer and a light emitting layer is intensified violent, which might make it very difficult to obtain a device free of problems in practical use.

In order to solve the above-mentioned problems of organic EL production by a wet method, the inventors of the disclosure found that electron transport properties and electron injection properties can be further improved and durability can be remarkably improved by coordinating a metal having a low electronegativity (1.6 or less) to a phosphine oxide derivative having excellent electron transport properties and electron injection properties. Based on the findings, the inventors developed an electron transport material including an alcohol-soluble phosphine oxide derivative and a metal having an electronegativity of 1.6 or less (see Patent Literature 1). By using this material, it is possible to use alcohol for film formation of an electron transport layer by a wet method. This makes it possible to construct an electron transport layer without damaging the light emitting layer comprising a luminescent polymer.

CITATION LIST

Patent Literature

Patent Literature 1: Unexamined Japanese Patent Application Kokai Publication No. 2010-278376

Non Patent Literature

Non Patent Literature 1: C. W. Tang, S. A. Van Slyke, "Organic electroluminescent diodes," Applied Physics Letters (US), The American Institute of Physics, Sep. 21, 1987, Vol. 51, No. 12, pp. 913-915

SUMMARY OF INVENTION

Technical Problem

However, an organic EL element, in which a phosphine oxide derivative which is not metal-doped with a metal is used as an electron transport material or a host material of a light emitting layer, has very short lifetime. This is one of the factors that make it difficult to apply a phosphine oxide derivative to the light emitting layer. Lin et al. reported based on the first-principles calculation results obtained by the density functional theory method that the chemical instability of a C—P bond in the anion state that received an injection of electrons is a factor of the instability of a phosphine oxide derivative used for the electron transport material or the host material for the light emitting layer (Na Lin, Juan Qiao, Lian Duan, Haifang Li, Liduo Wang, and Yong Qiu, J. Phys. Chem. C, 2012, 116(36), pp 19451-19457).

The present disclosure has been made in view of the above circumstances. An objective of the disclosure is to provide a novel organic electron transport material that is excellent in stability and durability, which is obtained by improving chemical stability of a C—P bond in the anion state, and an organic electroluminescent element using the same.

Solution to Problem

In consideration of the above circumstances, the inventors of the disclosure conducted the first-principles calculation based on the density functional theory method according to Lin et al. regarding chemical stability of a C—P bond of a phosphine oxide derivative in the anionic state. As a result, the inventors found that a diaryl phosphine oxide structure having a cyclic structure is preferable in order to improve chemical stability of a C—P bond in the anionic state. This has led to the completion of the disclosure.

In other words, a first aspect of the disclosure in accordance with the above objective is to provide an organic electron transport material, which comprises a compound represented by the following Formula (1), thereby achieving the above objective.

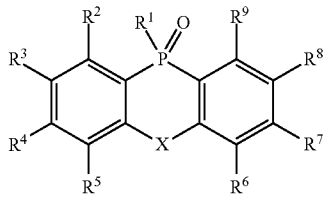

(1)

In Formula (1),
$R^1$ represents an atomic group which has either or both of one or more aryl groups and one or more heteroaryl groups and which may have a phosphine oxide group represented by the following Formula (2) on any one or more carbon atoms.

$R^2$ to $R^9$ each independently represent an atom or an atomic group selected from the group consisting of a hydrogen atom, a halogen atom, a cyano group, a $C_1$-$C_{12}$ linear or branched alkyl group, a linear or branched fluoroalkyl group, an aryl group, a substituted aryl group, a heteroaryl group, and a substituted heteroaryl group.

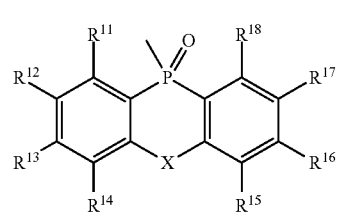

(2)

In Formula (2),
$R^{11}$ to $R^{18}$ each independently represent an atom or an atomic group selected from the group consisting of a hydrogen atom, a halogen atom, a $C_1$-$C_{12}$ linear or branched alkyl group, a linear or branched fluoroalkyl group, an aryl group, a substituted aryl group, a heteroaryl group, and a substituted heteroaryl group.

In Formulae (1) and (2),
X represents an atom or an atomic group represented by any one of the following Formulae (3) to (8).

(3)

(4)

(5)

(6)

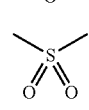

(7)

(8)

In Formula (3),
$R^{21}$ and $R^{22}$ each independently represent an atom or an atomic group selected from the group consisting of a hydrogen atom, a $C_1$-$C_{12}$ linear or branched alkyl group, a linear or branched fluoroalkyl group, an aryl group, a substituted aryl group, a heteroaryl group, and a substituted heteroaryl group.

In Formula (4),
$R^{31}$ represents an atom or an atomic group selected from the group consisting of a hydrogen atom, a $C_1$-$C_{12}$ linear or branched alkyl group, a linear or branched fluoroalkyl group, an aryl group, a substituted aryl group, a heteroaryl group, and a substituted heteroaryl group.

The second aspect of the disclosure is to provide an organic electroluminescent element, which comprises: a pair of electrodes composed of a positive electrode and a negative electrode; and a light emitting layer that is formed between the pair of electrodes so as to allow holes and electrons to be injected from the electrodes directly or via a different thin film layer and is electrically excited by recombination of holes and electrons injected from the electrodes so as to emit light, wherein the organic electroluminescent element contains a phosphine oxide derivative represented by the following Formula (1) and includes an electron transport layer that is disposed to be in contact with the negative electrode side of the light emitting layer, thereby achieving the above objective.

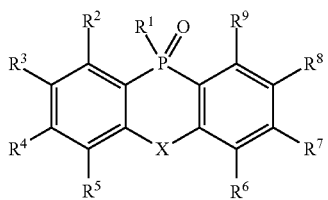

(1)

In Formula (1), $R^1$ represents an atomic group which has either or both of one or more aryl groups and one or more heteroaryl groups and which may have a phosphine oxide group represented by the following Formula (2) on any one or more carbon atoms.

$R^2$ to $R^9$ each independently represent an atom or an atomic group selected from the group consisting of a hydrogen atom, a halogen atom, a cyano group, a $C_1$-$C_{12}$ linear or branched alkyl group, a linear or branched fluoroalkyl group, an aryl group, a substituted aryl group, a heteroaryl group, and a substituted heteroaryl group.

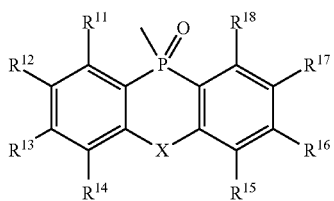

(2)

In Formula (2), $R^{11}$ to $R^{18}$ each independently represent an atom or an atomic group selected from the group consisting of a hydrogen atom, a halogen atom, a $C_1$-$C_{12}$ linear or branched alkyl group, a linear or branched fluoroalkyl group, an aryl group, a substituted aryl group, a heteroaryl group, and a substituted heteroaryl group.

In Formulae (1) and (2),

X represents an atom or an atomic group represented by any one of the following Formulae (3) to (8).

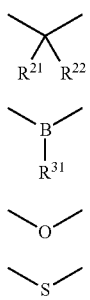

(3)

(4)

(5)

(6)

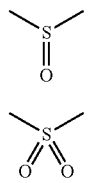

(7)

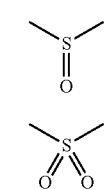

(8)

In Formula (3), $R^{21}$ and $R^{22}$ each independently represent an atom or an atomic group selected from the group consisting of a hydrogen atom, a $C_1$-$C_{12}$ linear or branched alkyl group, a linear or branched fluoroalkyl group, an aryl group, a substituted aryl group, a heteroaryl group, and a substituted heteroaryl group.

In Formula (4), $R^{31}$ represents an atom or an atomic group selected from the group consisting of a hydrogen atom, a $C_1$-$C_{12}$ linear or branched alkyl group, a linear or branched fluoroalkyl group, an aryl group, a substituted aryl group, a heteroaryl group, and a substituted heteroaryl group.

The third aspect of the disclosure is to provide an organic electroluminescent element, which comprises: a pair of electrodes composed of a positive electrode and a negative electrode; a compound that is formed between the pair of electrodes so as to allow holes and electrons to be injected from the electrodes directly or via a different thin film layer and is electrically excited by recombination of holes and electrons injected from the electrodes so as to emit light; and a light emitting layer that contains a phosphine oxide derivative represented by the following Formula (1), thereby achieving the above objective.

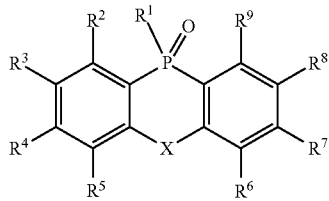

(1)

In Formula (1), $R^1$ represents an atomic group which has either or both of one or more aryl groups and one or more heteroaryl groups and which may have a phosphine oxide group represented by the following Formula (2) on any one or more carbon atoms.

$R^2$ to $R^9$ each independently represent an atom or an atomic group selected from the group consisting of a hydrogen atom, a halogen atom, a cyano group, a $C_1$-$C_{12}$ linear or branched alkyl group, a linear or branched fluoroalkyl group, an aryl group, a substituted aryl group, a heteroaryl group, and a substituted heteroaryl group.

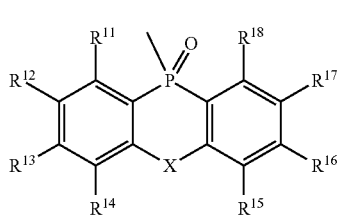

(2)

In Formula (2), $R^{11}$ to $R^{18}$ each independently represent an atom or an atomic group selected from the group consisting of a hydrogen atom, a halogen atom, a $C_1$-$C_{12}$ linear or branched alkyl group, a linear or branched fluoroalkyl group, an aryl group, a substituted aryl group, a heteroaryl group, and a substituted heteroaryl group.

In Formulae (1) and (2), X represents an atom or an atomic group represented by any one of the following Formulae (3) to (8).

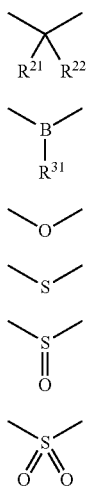

(3)

(4)

(5)

(6)

(7)

(8)

In Formula (3), $R^{21}$ and $R^{22}$ each independently represent an atom or an atomic group selected from the group consisting of a hydrogen atom, a $C_1$-$C_{12}$ linear or branched alkyl group, a linear or branched fluoroalkyl group, an aryl group, a substituted aryl group, a heteroaryl group, and a substituted heteroaryl group.

In Formula (4), $R^{31}$ represents an atom or an atomic group selected from the group consisting of a hydrogen atom, a $C_1$-$C_{12}$ linear or branched alkyl group, a linear or branched fluoroalkyl group, an aryl group, a substituted aryl group, a heteroaryl group, and a substituted heteroaryl group.

Advantageous Effects of Invention

According to the disclosure, a novel organic electron transport material that is excellent in stability and durability because of high chemical stability of a C—P bond in the anion state and an organic electroluminescent element using the same are provided.

BRIEF DESCRIPTION OF DRAWINGS

FIG. 1 is a cross-sectional view of an organic EL element according to Embodiment 2 of the disclosure.

DESCRIPTION OF EMBODIMENTS

Hereinafter, specific embodiments of the disclosure are described with reference to the attached drawings, which are provided for understanding the disclosure.

Embodiment 1

An organic electron transport material according to Embodiment 1 of the disclosure (hereinafter simply referred to as "organic electron transport material" in some cases) is a phosphine oxide derivative having a structure represented by the following Formula (1).

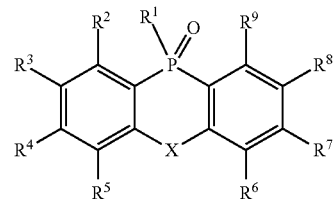

(1)

In Formula (1), $R^1$ represents an atomic group which has either or both of one or more aryl groups and one or more heteroaryl groups and which may have a phosphine oxide group represented by the following Formula (2) on any one or more carbon atoms.

$R^2$ to $R^9$ each independently represent an atom or an atomic group selected from the group consisting of a hydrogen atom, a halogen atom, a cyano group, a $C_1$-$C_{12}$ linear or branched alkyl group, a linear or branched fluoroalkyl group, an aryl group, a substituted aryl group, a heteroaryl group, and a substituted heteroaryl group.

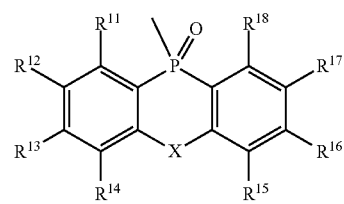

(2)

In Formula (2), $R^{11}$ to $R^{18}$ each independently represent an atom or an atomic group selected from the group consisting of a hydrogen atom, a halogen atom, a $C_1$-$C_{12}$ linear or branched alkyl group, a linear or branched fluoroalkyl group, an aryl group, a substituted aryl group, a heteroaryl group, and a substituted heteroaryl group.

In Formulae (1) and (2),

X represents an atom or an atomic group represented by any one of the following Formulae (3) to (8).

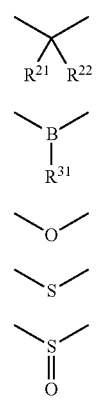

(3)

(4)

(5)

(6)

(7)

-continued

(8)

In Formula (3),

R$^{21}$ to R$^{22}$ each independently represent an atom or an atomic group selected from the group consisting of a hydrogen atom, a $C_1$-$C_{12}$ linear or branched alkyl group, a linear or branched fluoroalkyl group, an aryl group, a substituted aryl group, a heteroaryl group, and a substituted heteroaryl group.

In Formula (4),

R$^{31}$ represents an atom or an atomic group selected from the group consisting of a hydrogen atom, a $C_1$-$C_{12}$ linear or branched alkyl group, a linear or branched fluoroalkyl group, an aryl group, a substituted aryl group, a heteroaryl group, and a substituted heteroaryl group.

A specific example of an organic electron transport material is a compound represented by the following Formula.

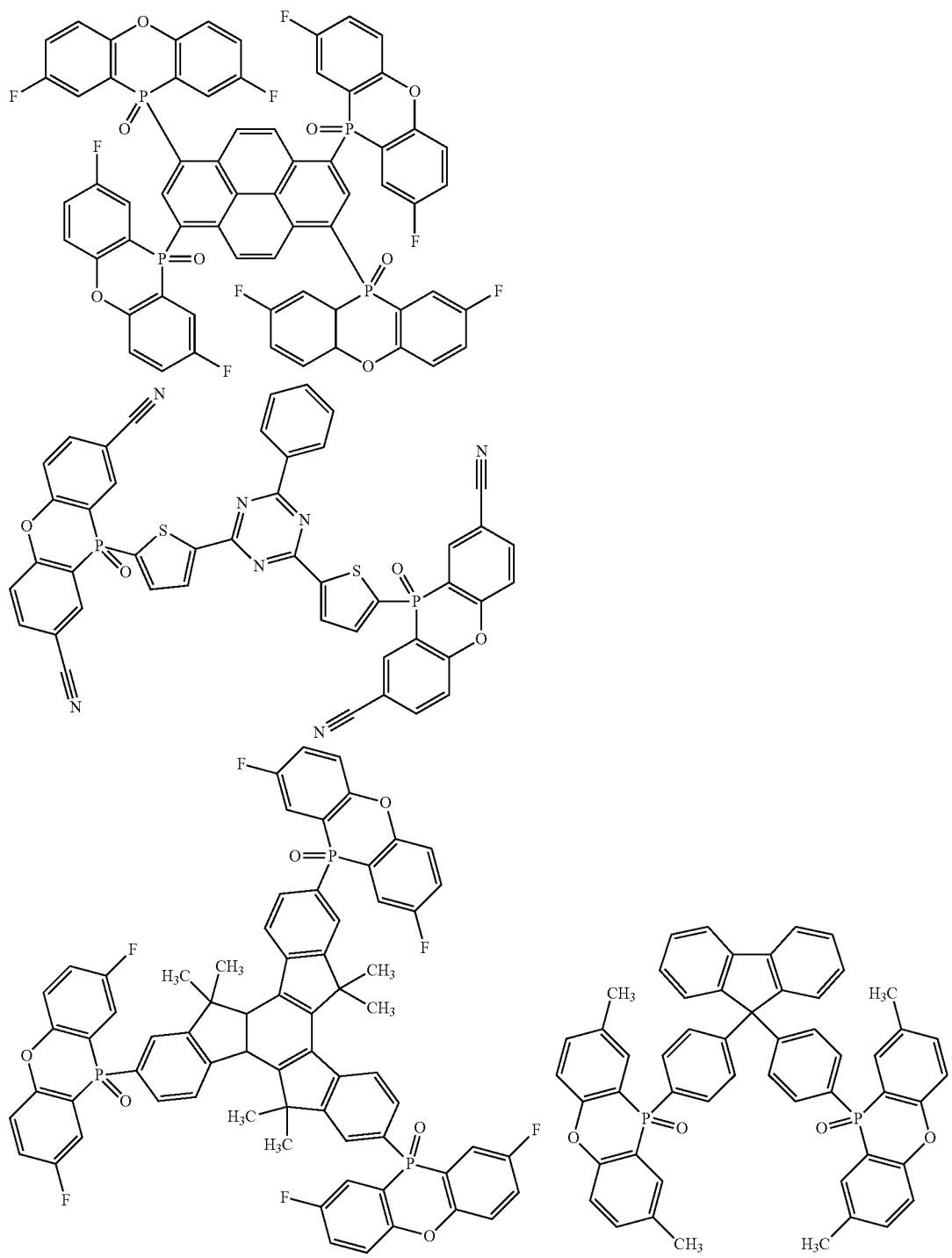

-continued
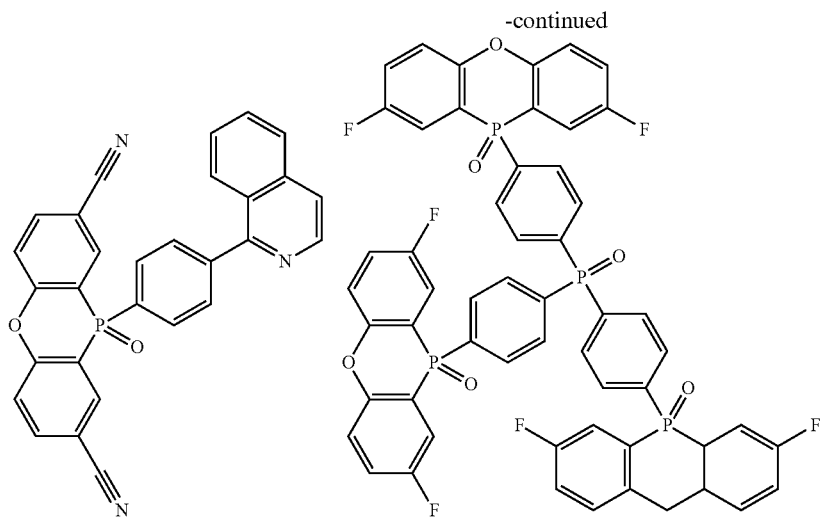
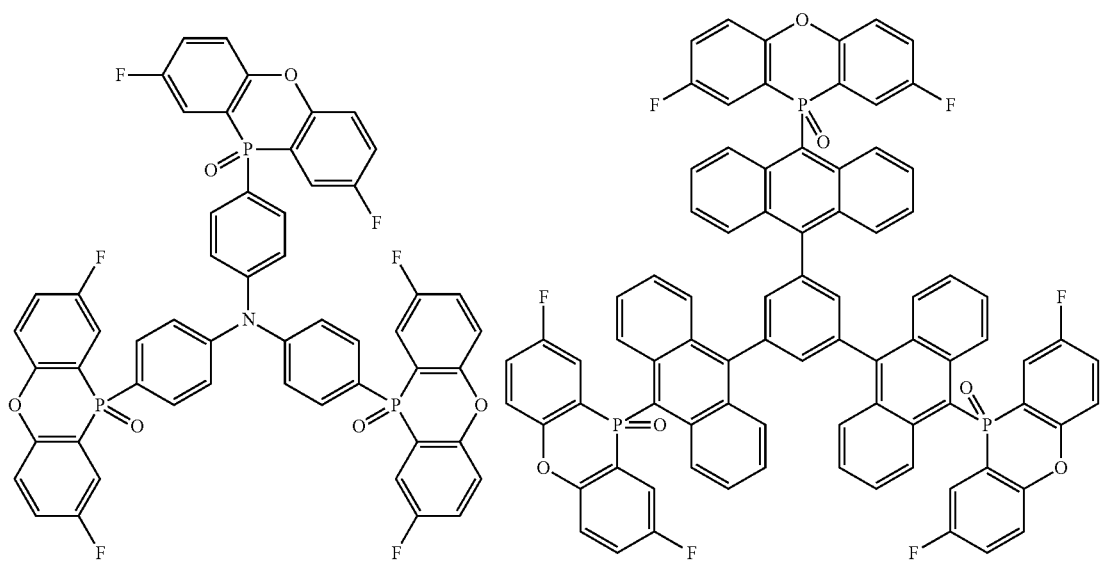
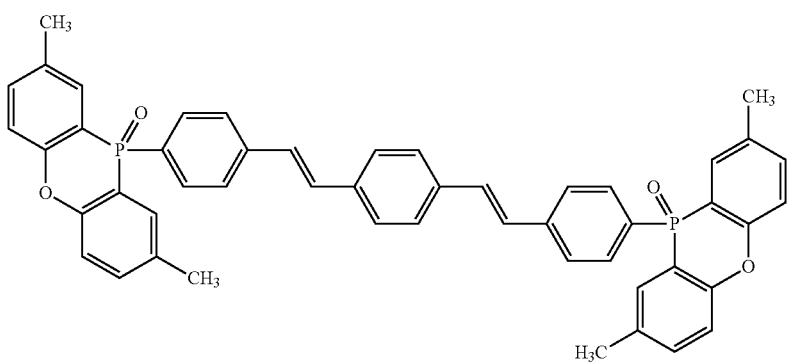

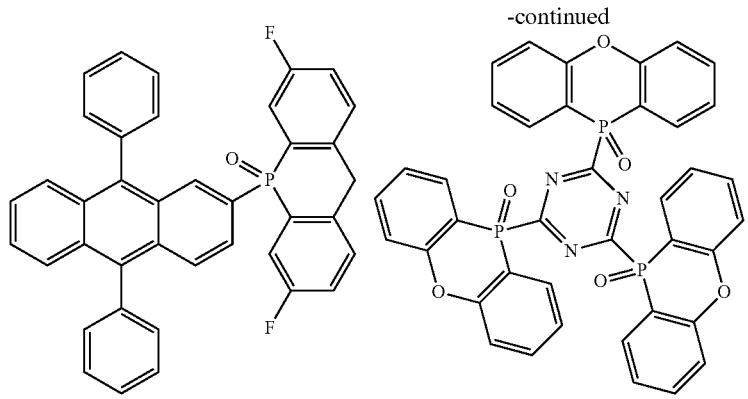

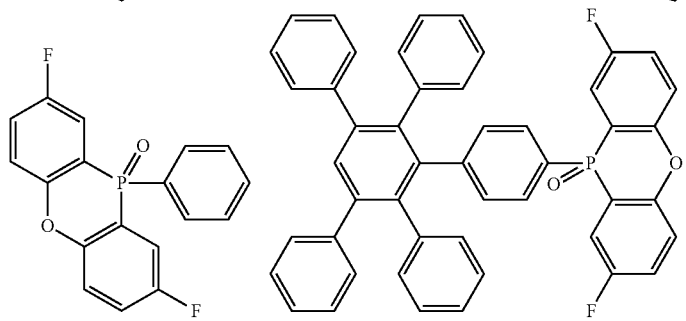

An organic electron transport material can be synthesized by any publicly known method. Specific examples thereof include, for example, method of the following Schemes 1 and 2.

Scheme 1

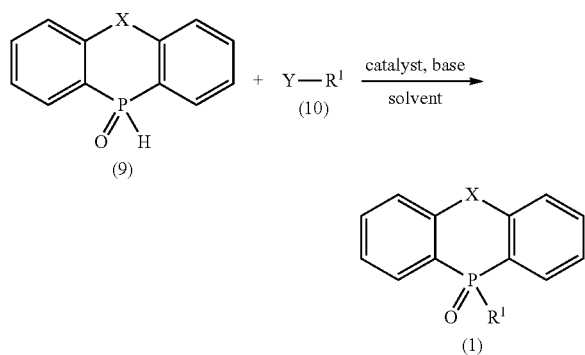

A coupling reaction of a publicly known diaryl phosphine oxide compound and halogenated aryl can be applied to Scheme 1. A compound represented by Formula (1) (where $R^2$ to $R^9$ each represent a hydrogen atom) can be obtained by condensation (dehydrohalogenation reaction) of a compound represented by Formula (9) and a compound represented by Formula (10) in a solvent in the presence of a condensation catalyst and/or a base as described above.

In the above formula, a case in which the compound (10) has a single leaving group Y per molecule is shown. However, the compound may have a plurality of leaving groups Y per molecule. Specific examples of leaving groups Y that can be used herein include a chlorine atom, a bromine atom, an iodine atom, a triflyl group (trifluoromethanesulfoxyl group), and a tosyl group (toluenesulfoxyl group).

Examples of the solvent include $C_1$-$C_8$ alcohols, dimethyl sulfoxide (DMSO), dimethyl formamide (DMF), tetrahydrofuran (THF), dioxane, pyridine, benzene, toluene, and xylene. Of these, DMSO is preferred from the viewpoint of yield.

Examples of the condensation catalyst include, for example, complex compounds of bisphosphinoalkane with palladium acetate [$Pd(OAc)_2$], nickel acetate [$Ni(OAc)_2$], and platinum group elements such as $Pd(OAc)_2$-1,3-bis(diphenylphosphino)propane[dppp], $Pd(OAc)_2$-1,2-bis(diphenylphosphino)ethane[dppe], $Pd(OAc)_2$-1,4-bis(diphenylphosphino)butane[dppb], $Ni(OAc)_2$-dppe, and $Ni(OAc)_2$-dppp. Of these, $Pd(OAc)_2$, $Pd(OAc)_2$-dppp, and $Pd(OAc)_2$-dppb are preferable from the viewpoint of yield.

In addition to the above, tetrakis(triphenylphosphine) palladium (0) and [1,1'-bis(diphenylphosphino)ferrocene] palladium (II), which are commonly used in cross-coupling, can also be used.

The amount of the catalyst to be used is about from 0.005 to 0.1 mol relative to 1 mol of a compound 10.

The above base has a function of capturing the hydrogen halide generated by condensation. Examples of such a base include: trialkylamines such as triethylamine, tripropylamine, and tributylamine; aliphatic tertiary amines such as N-ethyldiisopropylamine [DIEA]; and aromatic tertiary amines such as pyridine and N, N'-dimethylaminopyridine [DMAP]. Of these, DIEA and DMAP are preferable from the viewpoint of boiling point. The amount of the base to be used is an amount sufficient to capture the theoretical amount of hydrogen halide generated, which is about from 1.0 to 2 mol relative to 1 mol of the compound 10.

The reaction can be carried out at a reaction temperature of 80° C. to 180° C. From the viewpoint of yield, the reaction temperature is preferably from 100° C. to 160° C.

Scheme 2

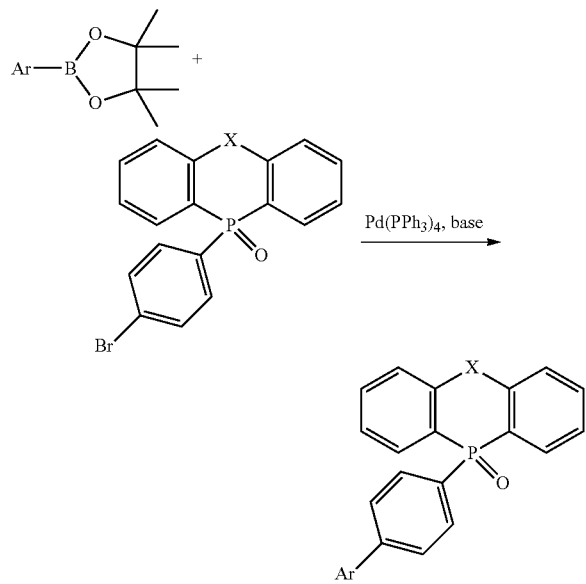

In Scheme 2, widely known Suzuki coupling is employed. Commonly used catalysts, bases, and solvents can be applied to conditions of Suzuki coupling. These are described in detail in publications such as "Organic Syntheses via Boranes Vol. 3" (written by Akira Suzuki et al.) and thus omitted herein. In addition to Suzuki coupling, a cross-coupling reaction such as Negishi coupling or Kumada coupling can be used as an alternative. However, in view of yield and the ease of operation, Suzuki coupling is preferable.

Embodiment 2: Organic Electroluminescent Element

An organic EL element 1, which is one example of the organic electroluminescent element according to Embodiment 2 of the disclosure include a plurality of organic compound layers (in the order of a hole transport layer 4, a light emitting layer 5, and an electron transport layer 6 from the side of a positive electrode 3 in the organic EL element 1 according to the present embodiment), which is layered such that it is sandwiched between the positive electrode 3 and a negative electrode 7 formed on a transparent substrate 2, and the organic EL element 1 as a whole is sealed with the sealing member 8.

Note that the expression "Y (an electrode or organic compound layer) is provided on X (an electrode or organic compound layer)" means that "Y is present on the surface on the side of negative electrode 7 of X such that the surface of X and the surface of Y are in contact with each other," and the expression "Y (an electrode or organic compound layer) is formed on X (an electrode or organic compound layer)" means that "Y is formed on the surface on the side of negative electrode 7 of X such that the surface of X and the surface of Y are in contact with each other."

First, the transparent substrate 2, positive electrode 3, and negative electrode 7 that constitute the organic EL element 1 will be explained.

[Transparent Substrate 2]

The transparent substrate 2 serves as a support of the organic EL element 1. The organic EL element 1 according to the present embodiment has a configuration (bottom emission type) in which light is extracted from the side of the transparent substrate 2. Therefore, the transparent substrate 2 and the positive electrode 3 each are formed with a substantially transparent (colorless transparent, colored transparent, translucent) material. Examples of the constituent material of the transparent substrate 2 include, for example, resin materials such as polyethylene terephthalate, polyethylene naphthalate, polypropylene, a cycloolefin polymer, polyamide, polyether sulfone, polymethyl methacrylate, polycarbonate, and polyarylate, and glass materials such as quartz glass and soda glass, which can be used singly or in combination of two or more thereof.

The average thickness of the transparent substrate 2 is, but is not particularly limited to, preferably from about 0.1 to 30 mm and more preferably from about 0.1 to 10 mm. In a case in which the organic EL element 1 has a configuration (top emission type) in which light is extracted from the side opposite the transparent substrate 2, an opaque substrate is sometimes used instead of the transparent substrate 2. Examples of the opaque substrate include a substrate formed with a ceramic material such as alumina, a surface obtained by forming an oxide film (insulating film) on a metal substrate such as stainless steel, and a substrate made of a resin material.

[Positive Electrode 3]

The positive electrode 3 is an electrode for injecting holes into the hole transport layer 4 described later. It is preferable to use, as a constituent material of positive electrode 3, a material that has a large work function and is excellent in electrical conductivity. Examples of the constituent material of the positive electrode 3 include, for example, oxides such as ITO (indium tin oxide), IZO (indium zirconium oxide), $In_2O_3$, $SnO_2$, Sb-containing $SnO_2$, and Al-containing ZnO, Au, Pt, Ag, Cu, or alloys containing these examples, which can be used singly or in combination of two or more thereof. The average thickness of the positive electrode 3 is, but is not particularly limited to, preferably from about 10 to 200 nm and more preferably from about 50 to 150 nm.

[Negative Electrode 7]

Meanwhile, the negative electrode 7 is an electrode for injecting electrons into the electron transport layer 6 described later, which is provided on the side opposite the light emitting layer 5 of the electron transport layer 6. As the constituent material of the negative electrode 7, it is preferable to use a material having a low work function. Examples of the constituent material of the negative electrode 7 include, for example, Li, Mg, Ca, Sr, La, Ce, Er, Eu, Sc, Y, Yb, Ag, Cu, Al, Cs, Rb, or alloys comprising these examples, which can be used in combination of arbitrary one or two or more thereof (for example, a layered product including a plurality of layers).

In particular, in a case in which an alloy is used as a constituent material of the negative electrode 7, it is preferable to use an alloy containing a stable metal element such as Ag, Al, or Cu, which is specifically an alloy such as MgAg, AlLi, or CuLi. With the use of such an alloy as a constituent material of the negative electrode 7, it is possible to improve the electron injection efficiency and stability of the negative electrode 7. The average thickness of the negative electrode 7 is, but is not particularly limited to, preferably from about 50 to 10000 nm and more preferably from about 80 to 500 nm.

In the case of the top emission type, the thickness of a material having a low work function or an alloy containing such a material is set to from about 5 to 20 nm, thereby allowing the material to have a permeability, and further, a highly permeable conductive material such as ITO is formed on the upper surface of the material to result in a thickness of from about 100 to 500 nm.

Note that since the organic EL element 1 according to the present embodiment is of the bottom emission type, the negative electrode 7 is not particularly required to have light transmissivity.

Next, organic compound layers (in the order of the hole transport layer 4, the light emitting layer 5, and the electron transport layer 6 from the side of the positive electrode 3) that constitutes the organic EL element 1 is described.

The hole transport layer 4 is provided on the positive electrode 3. The hole transport layer 4 functions to transport holes injected from the positive electrode 3 to the light emitting layer 5.

[Hole Transport Layer 4]

Specific examples of a constituent material of the hole transport layer 4 include: metal or metal-free phthalocyanine compounds such as phthalocyanine, copper phthalocyanine (CuPc), and iron phthalocyanine; polyarylamine such as polyaniline; aromatic amine derivatives; fluorene-arylamine copolymers, fluorene-bithiophene copolymers, poly(N-vinylcarbazole), polyvinyl pyrene, polyvinylanthracene, polythiophene, polyalkylthiophene, polyhexylthiophene, poly(p-phenylenevinylene), polyethylenevinylene, pyrene formaldehyde resins, ethylcarbazole formaldehyde resins, or derivatives thereof. These examples can be used in combination of one or two or more thereof in the form of a mixture or layered product.

Specific examples of aromatic amine derivatives include the following compounds.

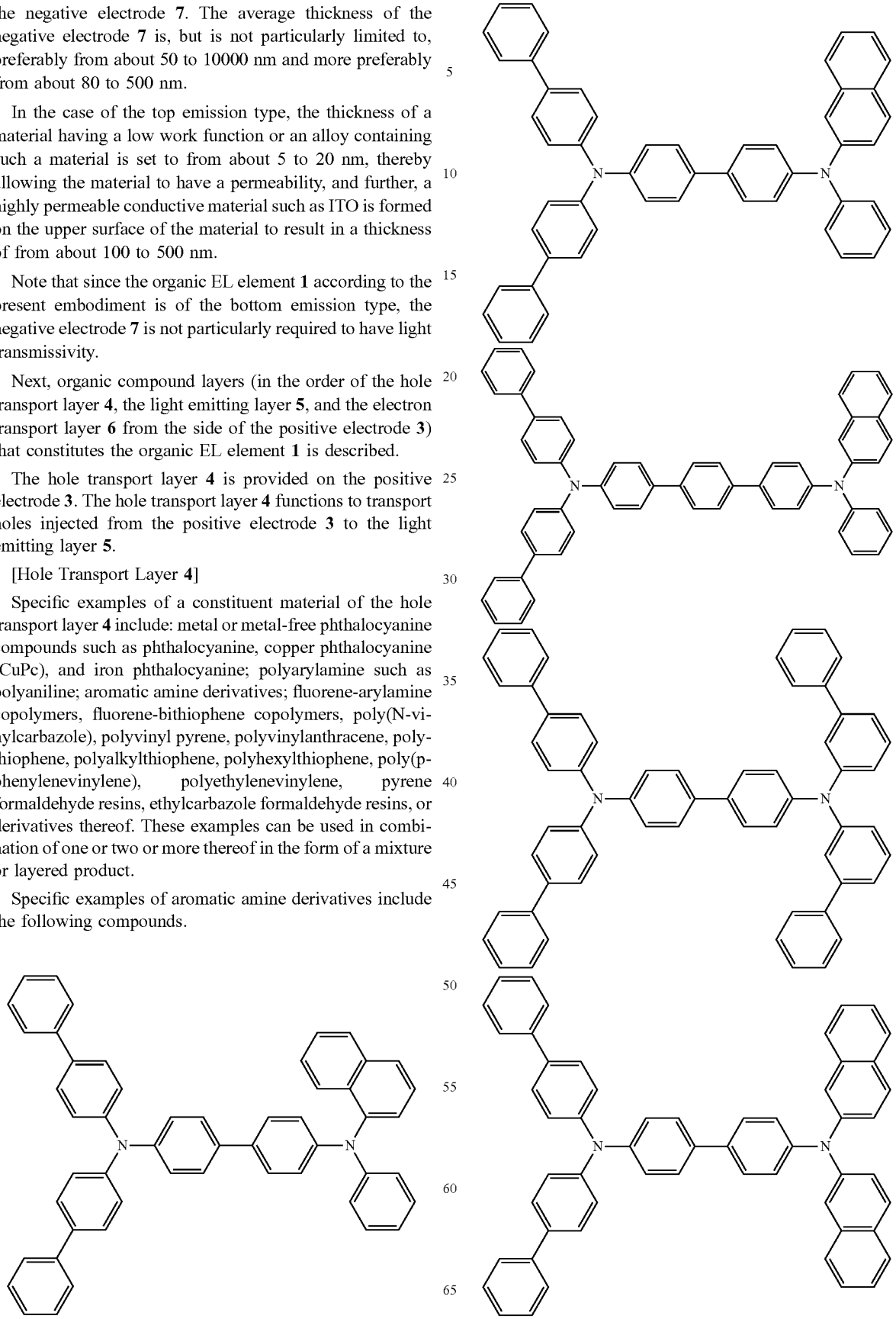

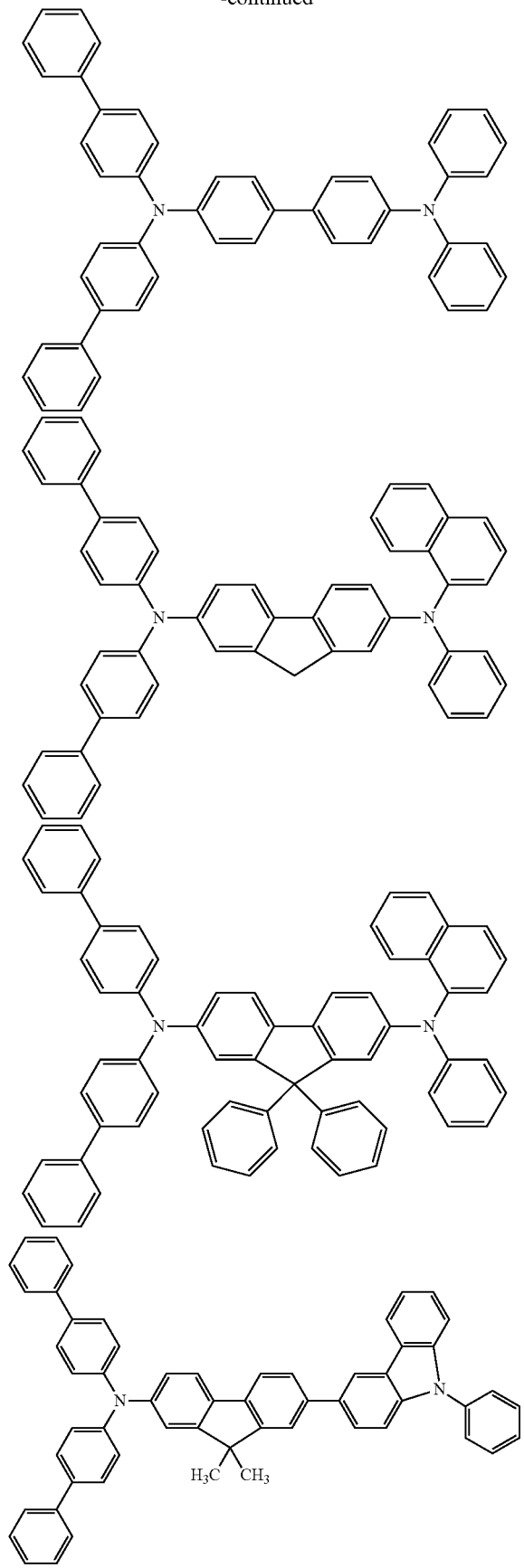
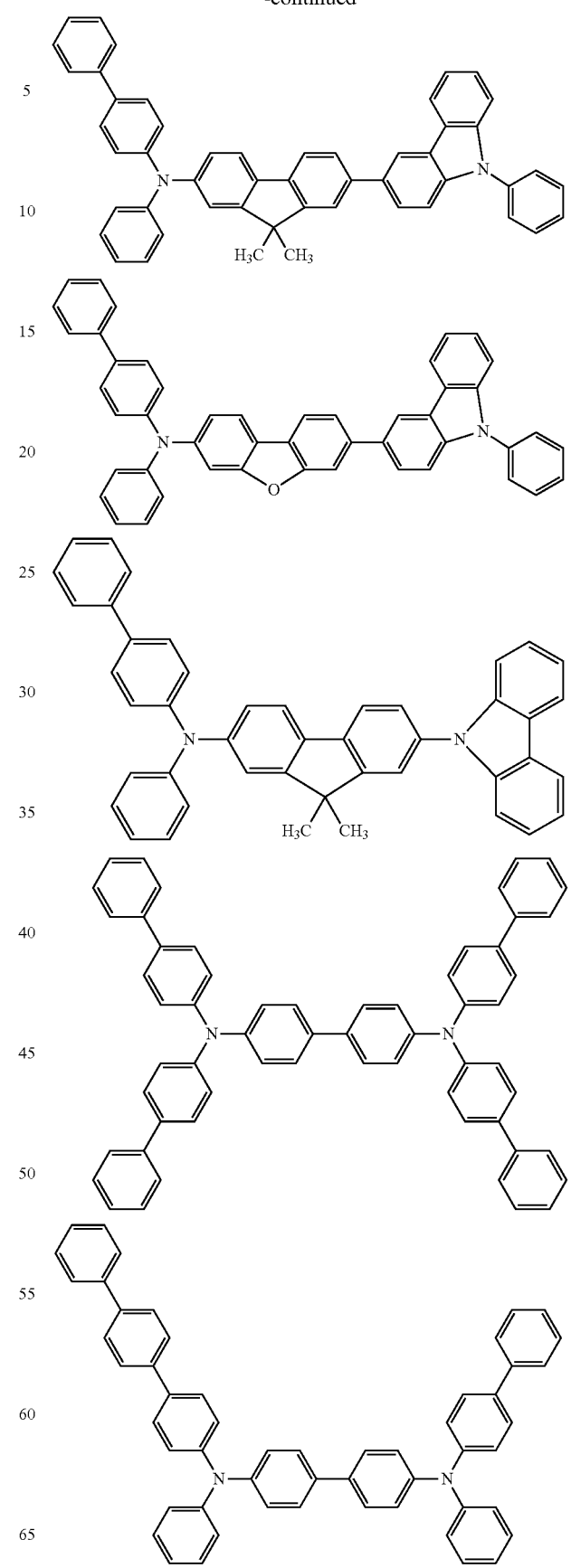

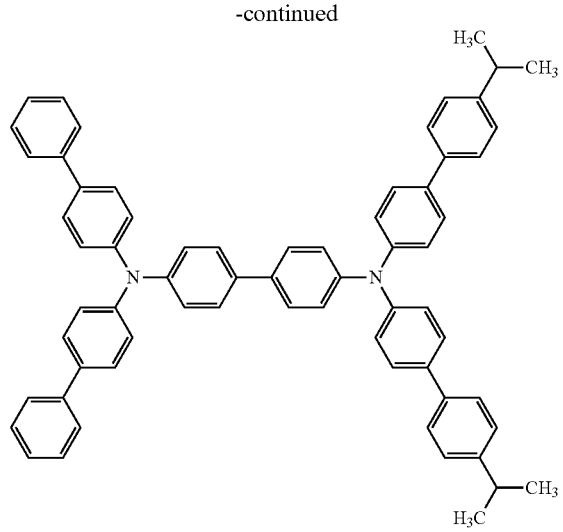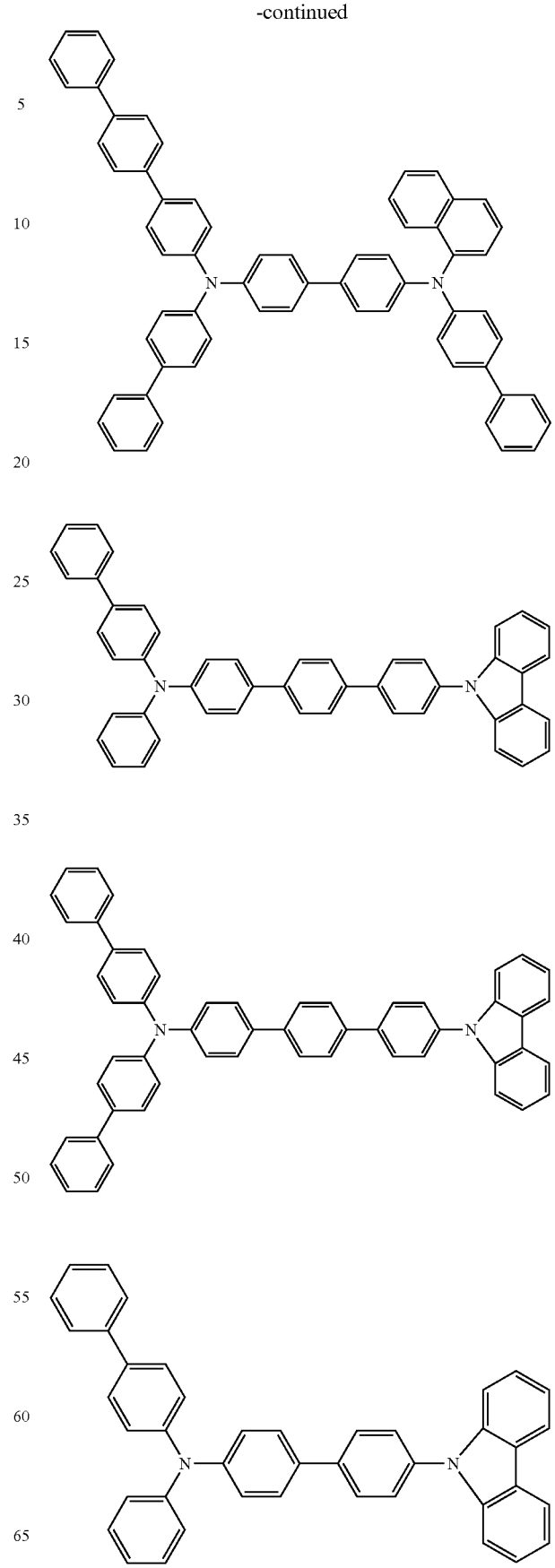

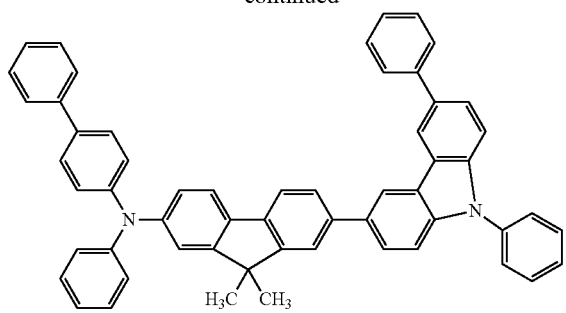
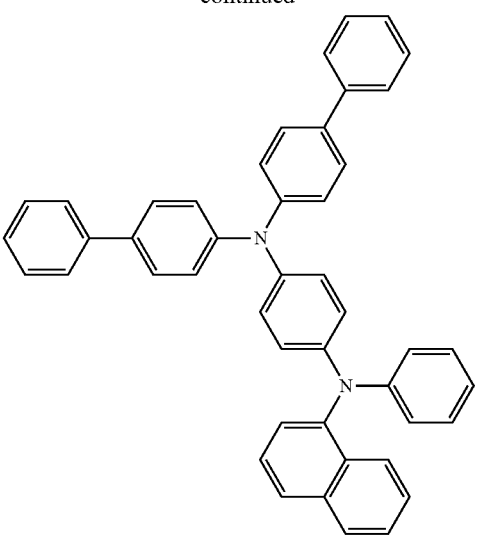
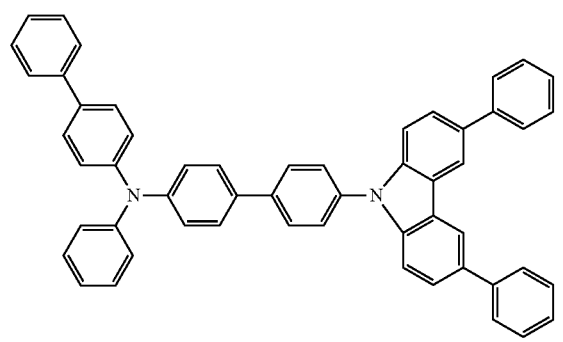
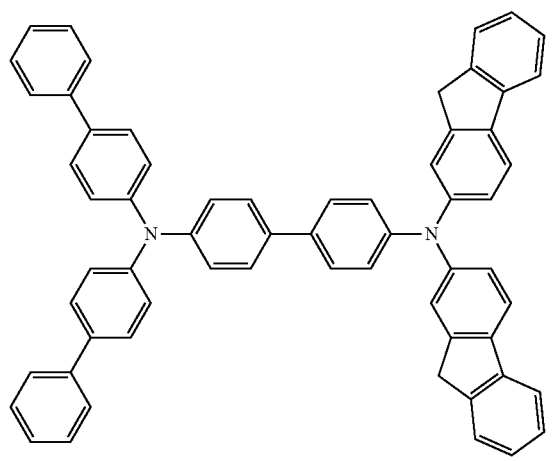
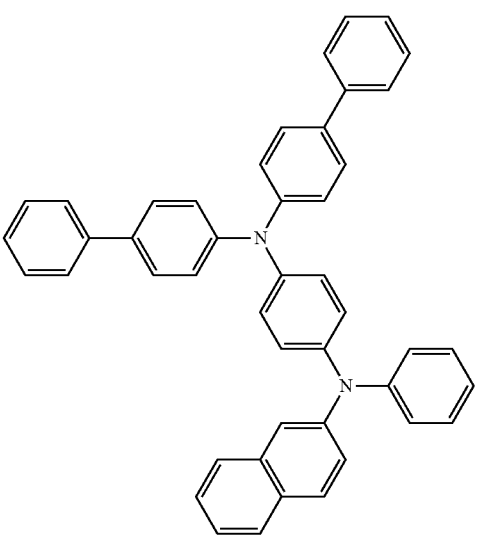
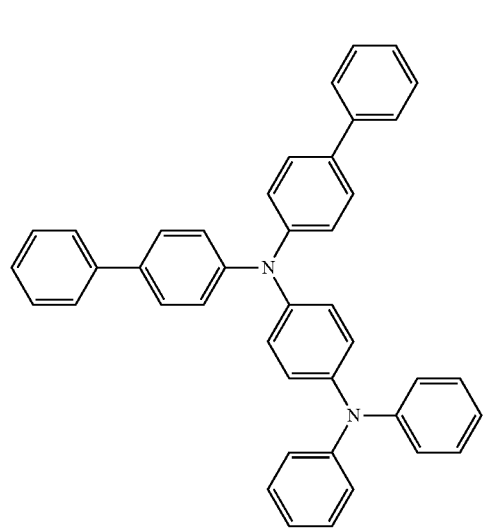
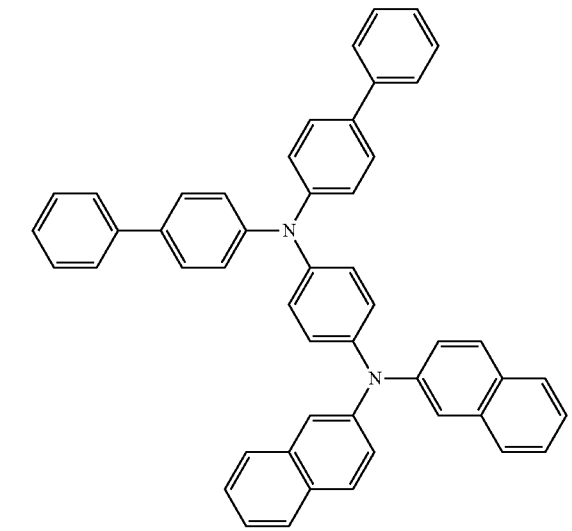

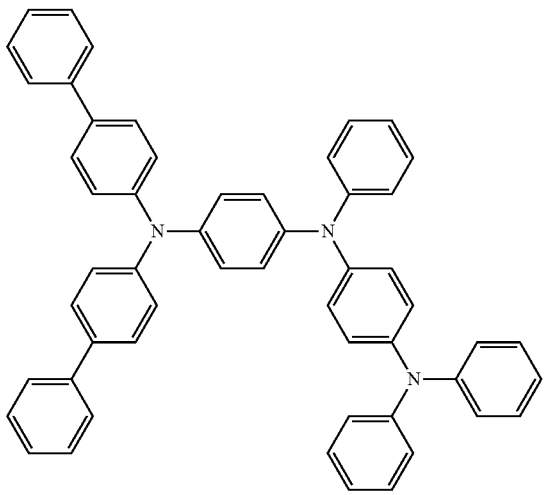

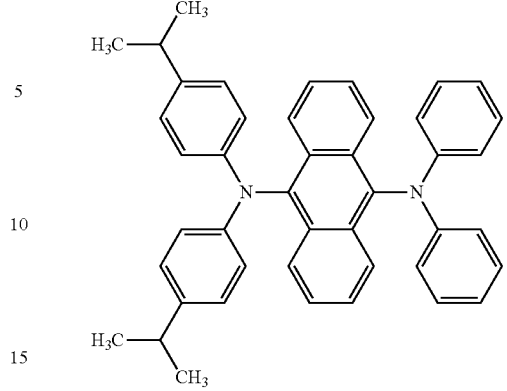

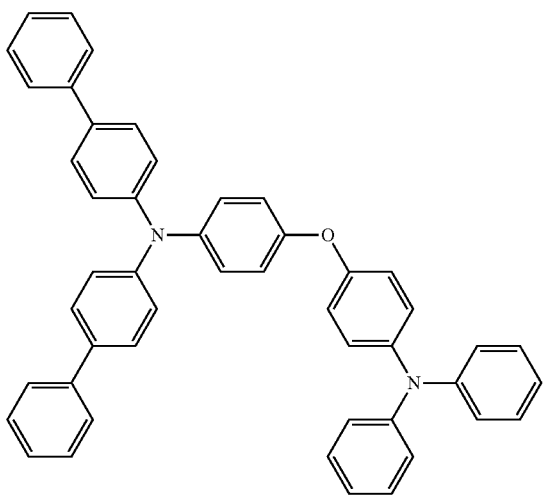

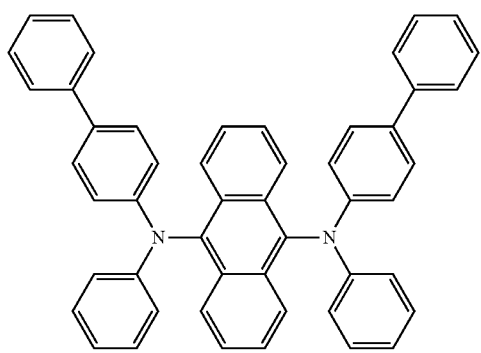

In addition, the above compounds may also be used in the form of a mixture with other compounds. One example of a mixture containing polythiophene is poly(3,4-ethylenedioxythiophene)/poly(styrenesulfonic acid) (PEDOT/PSS) or the like.

The average thickness of the hole transport layer 4 is, but is not particularly limited to, preferably from about 10 to 150 nm and more preferably from about 50 to 100 nm.

[Light Emitting Layer 5]

The light emitting layer 5 is provided on the hole transport layer 4, which means the surface on the side of the negative electrode 7. Into this light emitting layer 5, electrons from the electron transport layer 6 described later and holes from the hole transport layer 4 are supplied (injected). Then, holes and electrons are recombined, the energy released upon the recombination generates excitons, and the energy is released (emitted) when the excitons return to the ground state (fluorescence or phosphorescence) within the light emitting layer 5.

Among constituent materials of the light emitting layer 5, specific examples of the luminescent substance (guest material) having a light-emitting function include: benzene compounds such as 1,3,5-tris[(3-phenyl-6-trifluoromethyl)quinoxalin-2-yl] benzene (TPQ1) and 1,3,5-tris[{3-(4-t-butylphenyl)-6-trifluoromethyl}quinoxalin-2-yl]benzene (TPQ2); low-molecular compounds such as tris(8-hydroxyquinolato)aluminum ($Alq_3$) and factris(2-phenylpyridine) iridium ($Ir(ppy)_3$); and polymer compounds such as an oxadiazole polymer, a triazole polymer, a carbazole polymer, a polyfluorene polymer, and a polyparaphenylene vinylene polymer, which can be used singly or in combination of two or more thereof.

In addition, the light emitting layer 5 contains, as a material responsible for the charge transport of electrons or holes (host material), an organic electron transport material according to Embodiment 1 of the present disclosure. A guest material is uniformly distributed in a host material. The concentration of the guest material is generally about 0.1 to 1% by weight of the host material.

The light emitting layer 5 may further contain an electron transport auxiliary material and a hole transport auxiliary material, in addition to the above-mentioned host material and guest material.

Specific examples of an electron transport auxiliary material and a hole transport auxiliary material that can be added to the light emitting layer 5 include arbitrary materials used as constituent materials of the hole transport layer 4 and the electron transport layer 6 described later and any combination of two or more thereof. Alternatively, an electron transport material according to Embodiment 1 of the present disclosure may be used singly or in combination of another compound described above as a constituent material of the electron transport layer 6.

The average thickness of the light emitting layer 5 is, but is not particularly limited to, preferably from about 10 to 150 nm and more preferably from about 50 to 100 nm.

[Electron Transport Layer 6]

The electron transport layer 6 is provided on the light emitting layer 5. The electron transport layer 6 functions to transport holes injected from the negative electrode 7 to the light emitting layer 5.

Examples of constituent materials of the electron transport layer 6 include: various compounds such as triazole derivatives, oxazole derivatives, polycyclic compounds, hetero polycyclic compounds such as bathocuproine, oxadiazole derivatives, fluorenone derivatives, diphenylquinone derivatives, thiopyran dioxide derivatives, anthraquinodimethane derivatives, anthrone derivatives, carbodiimide derivatives, fluorenylidene methane derivatives, distyryl pyrazine derivatives, acid anhydrides of aromatic tetracarboxylic acids such as naphthalene tetracarboxylic acid or perylenetetracarboxylic acid, phthalocyanine derivatives, and 8-quinolinol derivatives; and metal complexes in which metal phthalocyanine, benzoxazole, or benzothiazole is a ligand, organic silane derivatives, iridium complexes, phosphine oxide derivatives such as alcohol-soluble phosphine oxide derivative disclosed in Unexamined Japanese Patent Application Kokai Publication No. 2010-278376, and any combination of two or more of these compounds.

The average thickness of the electron transport layer 6 is, but is not particularly limited to, preferably from about 1 to 100 nm and more preferably from about 10 to 50 nm.

The sealing member 8 is provided so as to cover the organic EL element 1 (the positive electrode 3, hole transport layer 4, light emitting layer 5, electron transport layer 6, and negative electrode 7), thereby airtightly sealing it and having a function of blocking oxygen and water. By providing the sealing member 8, it is possible to obtain the effects of improving reliability of the organic EL element 1 and preventing alteration and deterioration (improving durability), for example.

Examples of constituent materials of the sealing member 8 include, for example, Al, Au, Cr, Nb, Ta, or Ti and alloys containing these examples, silicon oxide, and various resin materials. In the case of using a material having conductivity as a constituent material of the sealing member 8, in order to prevent a short circuit, an insulating film preferably provided between the sealing member 8 and the organic EL element 1 if necessary. In addition, the sealing member 8 may be in the form of a flat plate such that it faces the transparent substrate 2 and a space therebetween is sealed with a sealant such as a thermosetting resin.

For example, an organic EL element 1 can be produced in the following manner. First, a transparent substrate 2 is prepared, and a positive electrode 3 is formed on this transparent substrate 2.

The positive electrode 3 can be formed by, for example, using a chemical vapor deposition (CVD) method such as plasma CVD, thermal CVD, or laser CVD, a dry plating method such as vacuum vapor deposition, sputtering, or ion plating, a wet plating method such as electrolytic plating, immersion plating, or electroless plating, thermal spraying method, a sol-gel method, an MOD method, or bonding of metallic foil.

Next, a hole transport layer 4 is formed on the positive electrode 3.

The hole transport layer 4 can be deposited using a vacuum vapor deposition method or a coating method. By using a coating method, for example, the hole transport layer 4 can be formed by supplying a hole transport material dissolved in a solvent or dispersed in a dispersion medium on the positive electrode 3, followed by drying (removal of the solvent or dispersion medium). As a method of supplying a material for forming a hole transport layer, for example, various coating method such as a spin coating method, a casting method, a micro-gravure coating method, a gravure coating method, a bar coating method, a roll coating method, a wire bar coating method, a dip coating method, a spray coating method, a screen printing method, a flexo printing method, an offset printing method, or an inkjet printing method can be used. By using such a coating method, it is possible to relatively easily form the hole transport layer 4.

The solvent or dispersion medium used for dissolution or dispersion is appropriately selected depending on the solubility of the hole transport material to be used, cost, availability, the ease of drying, safety, and the like. Specific examples of the solvent or dispersion medium are the following various organic solvents or mixed solvents containing them and the like, which include: inorganic solvents such as nitric acid, sulfuric acid, ammonia, hydrogen peroxide, water, carbon disulfide, carbon tetrachloride, and ethylene carbonate; ketone solvents such as methyl ethyl ketone (MEK), acetone, diethyl ketone, methyl isobutyl ketone (MIBK), methyl isopropyl ketone (MIPK), and cyclohexanone; alcohol solvents such as methanol, ethanol, isopropanol, ethylene glycol, diethylene glycol (DEG), and glycerin; ether solvents such as diethyl ether, diisopropyl ether, 1,2-dimethoxyethane (DME), 1,4-dioxane, tetrahydrofuran (THF), tetrahydropyran (THP), anisole, diethyleneglycol dimethyl ether (diglyme), and diethyleneglycol ethyl ether (carbitol); cellosolve solvents such as methyl cellosolve, ethyl cellosolve, and phenyl cellosolve; aliphatic hydrocarbon solvents such as hexane, pentane, heptane, and cyclohexane; aromatic hydrocarbon solvents such as toluene, xylene, and benzene; aromatic heterocyclic compound solvents such as pyridine, pyrazine, furan, pyrrole, thiophene, and methyl pyrrolidone; amide solvents such as N,N-dimethyl formamide (DMF), N,N-dimethylacetamide (DMA); halogen compound solvents such as chlorobenzene, dichloromethane, chloroform, and 1,2-dichloroethane; ester solvents such as ethyl acetate, methyl acetate, and ethyl formate; sulfur compound solvents such as dimethyl sulfoxide (DMSO) and sulfolane; nitrile solvents such as acetonitrile, propionitrile, acrylonitrile; and organic acid solvents such as formic acid, acetic acid, trichloroacetic acid, and trifluoroacetic acid.

Drying may be carried out by, for example, standing in an atmospheric pressure or reduced pressure atmosphere, heat treatment, spraying of inert gas, or the like.

Further, oxygen plasma treatment may be performed on the upper surface of the positive electrode 3 prior to this step. This allows imparting lyophilic properties to the upper surface of the positive electrode 3, removing organic matter attached to the upper surface of the positive electrode 3 (washing), adjusting the work function in the vicinity of the upper surface of the positive electrode 3, and the like.

Here, preferable conditions for oxygen plasma treatment include, for example, the following: plasma power: about 100 to 800 W; oxygen gas flow rate: about 50 to 100 mL/min; processed member (positive electrode 3) transport rate: about 0.5 to 10 mm/second; and temperature of transparent substrate 2: about 70° C. to 90° C.

Next, a light emitting layer 5 is formed on the hole transport layer 4 (on one surface side of the positive electrode 3).

A light emitting layer 5 can be deposited by a vacuum vapor deposition method or a coating method. By using a coating method, for example, the light emitting layer 5 can be formed by supplying a host material dissolved in a solvent or dispersed in a dispersion medium on the hole transport layer 4, followed by drying (removal of the solvent or dispersion medium). It is desirable to select as a solvent or dispersion medium to be used, a solvent or dispersion medium that does not allow the hole transport layer 4 to be dissolved, eroded, or swollen.

A method of drying a host material and a guest material dispersed in a solvent or dispersion medium is the same as that described in the formation of the hole transport layer 4.

Next, an electron transport layer 6 is formed on the light emitting layer 5 (on one surface side of positive electrode 3).

The electron transport layer 6 can be deposited using a vacuum vapor deposition method or a coating method as in the case of the hole transport layer 4 and the light emitting layer 5. By using a coating method, the electron transport layer 6 can be obtained by supplying an electron transport material dissolved in a solvent or dispersed in a dispersion medium on the light emitting layer 5, followed by drying. It is desirable to select as a solvent or dispersion medium to be used, a solvent or dispersion medium that does not allow the light emitting layer 5 to be dissolved, eroded, or swollen. A method of drying an electron transport material dissolved in a solvent or dispersion medium is the same as that described in the formation of the hole transport layer 4 and the light emitting layer 5. Therefore, a detailed description thereof is omitted.

Next, a negative electrode 7 is formed on the electron transport layer 6 (on the side opposite the light emitting layer 5). The negative electrode 7 can be deposited using, for example, a vacuum vapor deposition method, a sputtering method, bonding of metallic foil, coating with metal fine particle ink, and baking.

Eventually, a sealing member 8 is placed to cover the obtained organic EL element 1 and bonded to the transparent substrate 2. Through the above steps, the organic EL element 1 is obtained.

Such an organic EL element 1 can be used as, for example, a light source or the like. Further, by arranging a plurality of organic EL elements 1 by arranging in a matrix, it is possible to construct a display device. As a method of driving a display device is not particularly limited, and it may be either an active matrix method or a passive matrix method.

A source of electrical energy supplied to the organic EL element 1 is mainly a direct current while it is also possible to use a pulse current or alternating current. Although the current and voltage values are not particularly limited, it is desirable to achieve maximum brightness at the lowest possible energy in view of the power consumption and lifetime of the element.

A "matrix" that constitutes a display device is a device in which pixels are disposed in a grid pattern for the display purpose, and characters and images are displayed by sets of pixels. The shape and size of a pixel are determined by its application. For example, square pixels having a side of 300 µm or less are usually used for the image and character display of personal computers, monitors, and TV. For large displays such as display panels, pixels having a millimeter-order side length are used. For monochrome display, pixels of the same color may be arranged. However, in the case of color display, red, green, and blue pixels are arranged for display. In this case, typically, there are delta and stripe arrangements. A method of driving the matrix may be either a passive matrix method or an active matrix method. Although the former passive matrix is advantageous in that the structure is simple, the latter active matrix is superior thereto in consideration of operating characteristics in some cases. It is therefore necessary to select the method depending on the usage.

The organic EL element 1 may be a segment-type display device. The term "segment type" means that a pattern having a predetermined shape is formed to allow a specific region to emit light so as to display a given information. For example, segment-type display includes time and temperature display in a digital clock or thermometer, operating state display in an audio equipment, an electromagnetic cooker, or the like, and automobile panel display. The matrix display and the segment display may coexist in the same panel.

The organic EL element 1 may be a backlight that is used for liquid crystal display devices, watches, audio equipment, automobile panels, display panels, signs, and the like in order to improve the visibility of a non-self luminous display device. In particular, when the organic EL element 1 is used as a backlight for a liquid crystal display device and especially a personal computer for which there is an expectation to realize a thinner display device, the organic EL element 1 will achieve a thinner and lighter display device as compared with the conventional one composed of a fluorescent lamp and a light guide plate.

Such an organic EL element 1 can be used as, for example, a light source or the like. Further, by disposing a plurality of organic EL elements 1 by arranging in a matrix, it is possible to construct a display device.

As a method of driving a display device is not particularly limited, it may be either an active matrix method or a passive matrix method.

In the organic EL element 1, it is possible to provide an electron injection layer (not shown) between the negative electrode 7 and the electron transport layer 6. The electron injection layer is used for the improvement of efficiency of electron injection from the negative electrode 7 to the electron transport layer 6, which means reduction of driving voltage. It is preferable to use at least one metal compound selected from the group consisting of an alkali metal chalcogenide, an alkaline earth metal chalcogenide, an alkali metal halide, an alkaline earth metal halide, an alkali metal carbonate, an alkaline earth metal carbonate, an alkali metal hydrogen carbonate, an alkaline earth metal, and hydrogen carbonate for the electron injection layer. When the electron injecting layer is formed with such as alkali metal chalcogenide and the like, it is preferable in that it is possible to further improve the electron injection property. Specific examples of a preferred alkali metal chalcogenide include, for example, lithium oxide ($Li_2O$), potassium oxide ($K_2O$), sodium sulfide ($Na_2S$), sodium selenide ($Na_2Se$), and sodium oxide ($Na_2O$). Examples of a preferred alkaline earth metal chalcogenide include, for example, calcium oxide (CaO), barium oxide (BaO), strontium oxide (SrO), beryllium oxide (BeO), barium sulfide (BaS), and calcium selenide (CaSe). Further, examples of a preferred alkali metal halide include, for example, lithium fluoride (LiF), sodium fluoride (NaF), potassium fluoride (KF), lithium chloride (LiCl), potassium chloride (KCl), and sodium chloride (NaCl). Furthermore, examples of a preferred alkaline earth metal halide include, for example, calcium fluoride ($CaF_2$), barium fluoride ($BaF_2$), strontium fluoride ($SrF_2$), magnesium fluoride ($MgF_2$), and beryllium fluoride ($BeF_2$), and also halides other than fluorides.

In addition to the above inorganic compounds, an organic metal complex containing an alkali metal and an alkaline earth metal can be used. Specific examples of a preferred organic metal complex include complexes of alkali metals and alkaline earth metals with ligands that include β-diketones such as acetylacetone, dibenzoylmethane, and 2,2,6,6-tetramethyl-3,5-heptanedione and heterocycles such as 8-hydroxyquinoline and 2-picolinic acid.

In addition, a hole blocking layer (not shown) may be provided between the light emitting layer 5 and the electron transport layer 6. By providing the hole blocking layer, it is possible to suppress influx of holes into the electron transport layer 6 and also to increase the luminous efficiency and extend the lifetime of the organic EL element 1. The hole blocking layer used herein may be provided using the electron transport material described above. It is preferable to form the hole blocking layer as a mixed layer obtained by mixing and layering two or more kinds of electron transport materials by co-evaporation or the like. It is preferable to increase the ionization potential of the electron transport material contained in the hole blocking layer to a level greater than that of the light emitting layer 5.

It is also possible to provide a hole injection layer (not shown) between the hole transport layer 4 and the positive electrode 3. As a constituent material of the hole injection layer, any of those appropriately selected from the specific examples of the constituent material of the hole transport layer 4 described above can be used. However, a material that transports holes to the light emitting layer 5 at a lower field strength than that of the material of the hole transport layer 4 is preferable.

EXAMPLES

Next, the examples carried out for confirming the effects of the disclosure will be described below.

Example 1: Evaluation of Stability of Phosphine Oxide Derivatives in the Anion State by the First-Principles Calculation Based on the Density Functional Theory Method Optimization of the structure and calculation of heat of formation were conducted on a workstation under the following conditions using GAMESS as the calculation program.

Neutral molecule, cation, anion fragment: RHF (restricted Hartree-Fock method)/6-31G (d)/B3LYP Cation, anion molecule, neutral fragment: UHF (unrestricted Hartree-Fock method)/6-31G (d)/B3LYP Single point calculation was performed on fragment molecules among the above based on the parent ion conformation.

Based on the results of heat of formation, bond dissociation energy (BDE) of a dissociation reaction represented by the following Formula (1) was calculated.

$$M \rightarrow F1 + F2 \qquad (1)$$

In this case, bond dissociation energy is obtained by the following Formula (2).

$$BDE = H_M - (H_{F1} + H_{F2}) \qquad (2)$$

BDE: Bond dissociation energy $H_M$: Heat of formation of the parent molecule $H_{F1}$, $H_{F2}$: Heat of formation of the respective fragment molecules It was confirmed that the calculation results of Lin et al. can be reproduced in a model compound system. Bond dissociation energy was calculated for the following compounds. Table 1 lists the results. It was found that cross-linking results in an increase of about 12 to 15 kcal/mol in BDE of the anion.

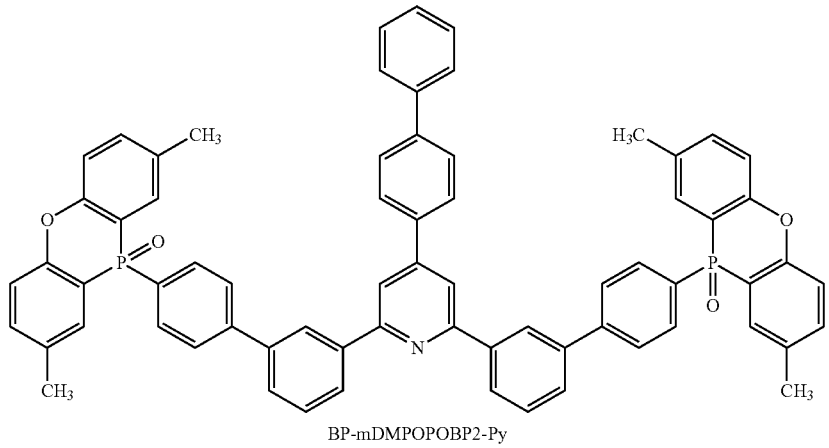

BP-mDMPOPOBP2-Py

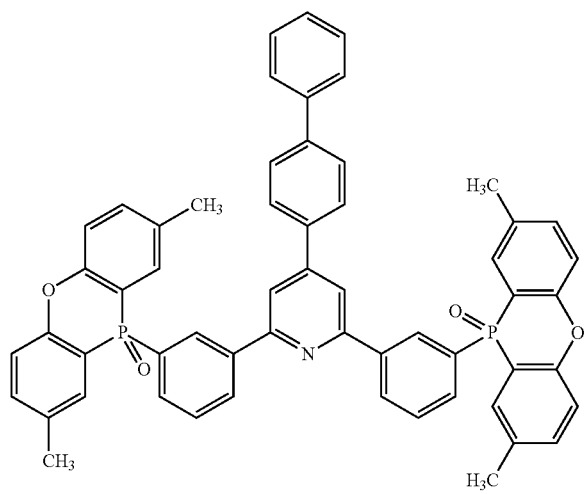
BP-mDMPOPOPh2-Py
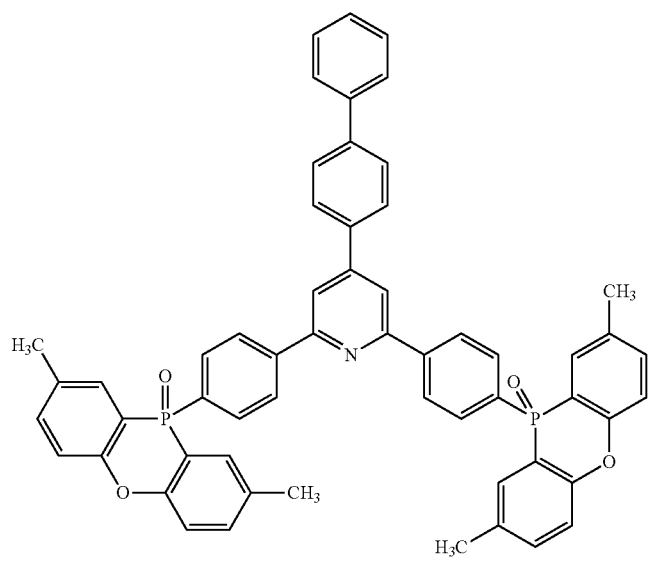
BP-pDMPOPOPh2-Py
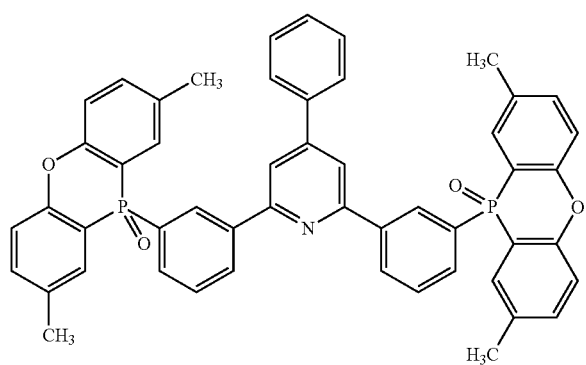
Ph-mDMPOPOPh2-Py

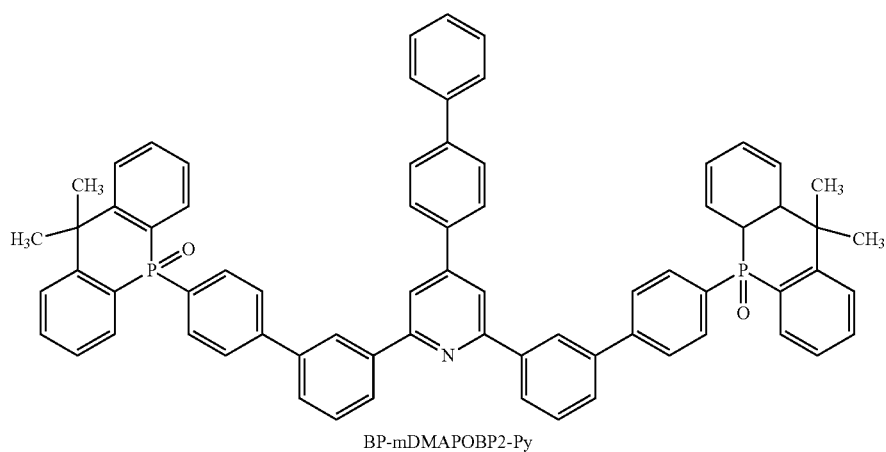
BP-mDMAPOBP2-Py
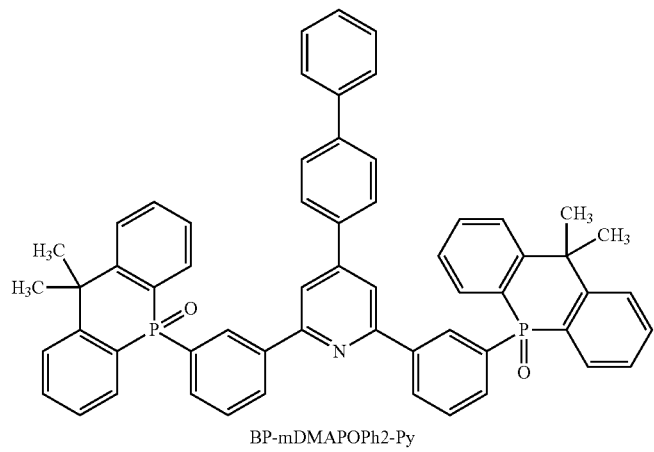
BP-mDMAPOPh2-Py
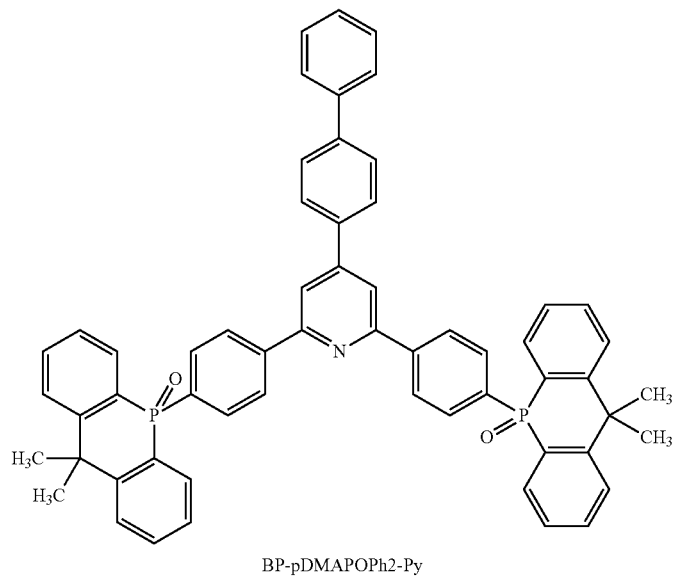
BP-pDMAPOPh2-Py

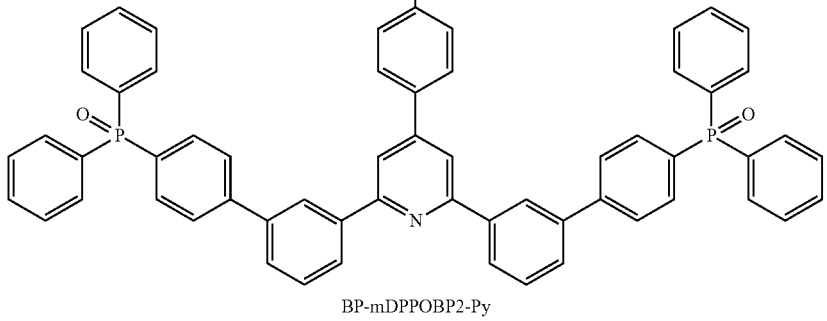

BP-mDPPOBP2-Py

TABLE 1

BDE of P-C bond of molecule crosslinked to DPPO

| | BDE of neutral kcal/mol | BDE of cation kcal/mol | BDE of anion kcal/mol |
|---|---|---|---|
| BP-mDMPOPOBP2-Py | 86.66 | 112.90 | 85.41 |
| BP-mDMPOPOPh2-Py | 86.55 | 113.73 | 86.59 |
| BP-pDMPOPOPh2-Py | 86.28 | 113.72 | 87.62 |
| Ph-mDMPOPOPh2-Py | 86.53 | 113.92 | 83.95 |
| BP-MDMAPOBP2-Py | 89.75 | 112.64 | 87.92 |
| BP-mDMAPOPh2-Py | 86.82 | 112.29 | 86.40 |
| BP-pDMPOPh2-Py | 86.80 | 109.45 | 83.08 |
| BP-mDPPOBP2-Py (non-crosslinked) | 86.84 | 86.88 | 73.22 |

Example 2: Synthesis of the Basic Structure of Electron Transport Material Synthesis of 2,6-(p-bromophenyl)-4-biphenylpyridine

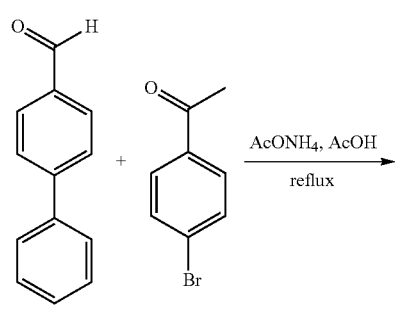

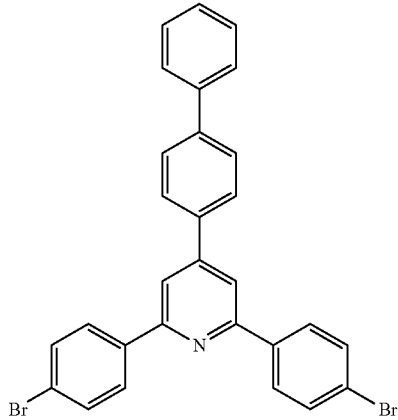

4-Phenyl benzaldehyde in an amount of 4.61 g (25.3 mmol), 4'-bromoacetophenone in an amount of 10.1 g (50.6 mmol), and ammonium acetate in an amount of 25.1 g (325 mmol) were added to 63.4 mL of acetic acid and refluxed for 9 hours. After the completion of the reaction, the mixture was cooled to room temperature, and the resulting precipitated crystals were collected by filtration and washed with ethanol. The crystals were recrystallized from dichloromethane/IPA to give 4.42 g (32%) of the title compound.

APCI TOF MS m/z=538, 540, 542

Synthesis of 2,6-bis(3-bromophenyl)-4-biphenylpyridine

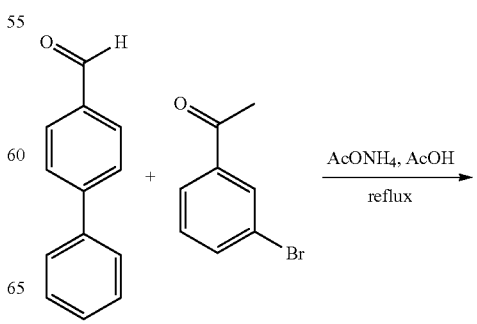

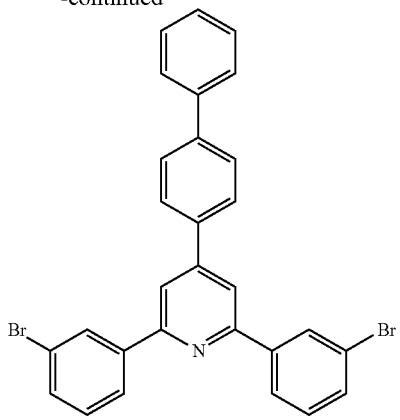

4-Phenyl benzaldehyde in an amount of 4.62 g (25.3 mmol), 3'-bromoacetophenone in an amount of 10.1 g (50.6 mmol), and ammonium acetate in an amount of 25.1 g (325 mmol) were added to 63.4 mL of acetic acid and refluxed for 9 hours. After the completion of the reaction, the mixture was cooled to room temperature, precipitated crystals were collected by filtration, and the resulting precipitate was washed with ethanol. The crystals were recrystallized from dichloromethane/IPA to give 3.85 g (28%) of the title compound.

APCI TOF MS m/z=538, 540, 542

Synthesis of 2,4-bis(4-bromophenyl)-6-phenyl-1,3,5-triazine

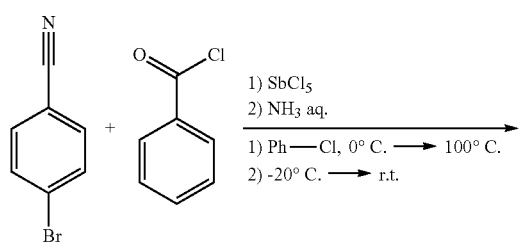

Benzoyl chloride in an amount of 3.51 g (25 mmol) and 4-bromobenzonitrile in an amount of 9.10 g (50 mmol) were dissolved in 37.5 mL of chlorobenzene and cooled to 0° C. Antimony chloride (V) in an amount of 7.48 g (25 mmol) was added dropwise to the resulting solution and stirred at room temperature for 20 minutes and at 100° C. for 2 hours. After the completion of the reaction, the mixture was cooled to −20° C. and quenched with the addition of 20 mL of 25% aqueous ammonia during vigorous stirring. Chlorobenzene in an amount of 25 mL was added at room temperature, water was removed by azeotropic distillation. The residue was heated to 130° C. and hot-filtered. The residue on the filter paper was added to 25 mL of chloroform and hot-filtered again by heating. Methanol in an amount of 50 mL was added to the obtained filtrate, and the resulting precipitate was collected to give 7.00 g (60%) of the title compound.

APCI TOF MS m/z=465, 467, 469

Synthesis of 2,6-(4-iodophenyl)-4-biphenylpyridine

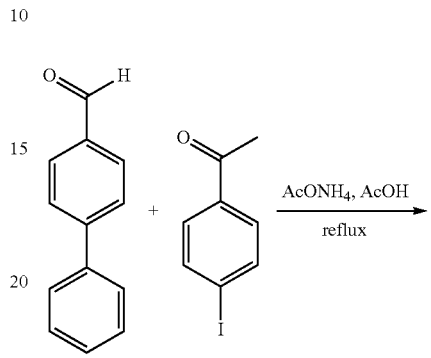

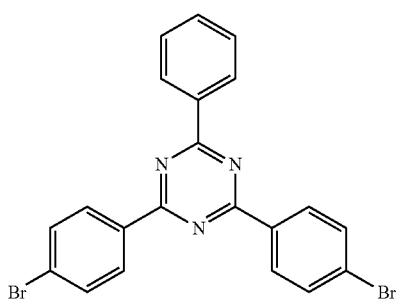

4-Phenyl benzaldehyde in an amount of 2.31 g (13 mmol), 4'-iodoacetophenone in an amount of 6.22 g (25 mmol), and ammonium acetate in an amount of 12.6 g (163 mmol) were added to 32 mL of acetic acid and refluxed for 9 hours. After the completion of the reaction, the mixture was cooled to room temperature, and precipitated crystals were collected by filtration and the crystals were further washed with ethanol. The obtained crystals were recrystallized from dichloromethane/IPA to give 0.75 g (9%) of the title compound.

APCI TOF MS m/z=634

Synthesis of 2,6-(3-iodophenyl)-4-biphenylpyridine

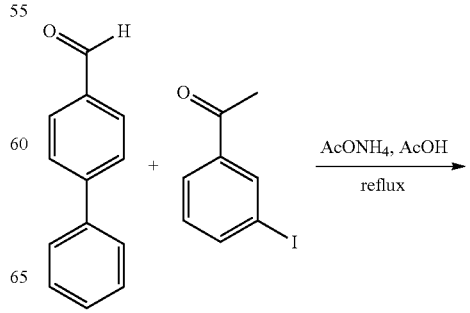

-continued

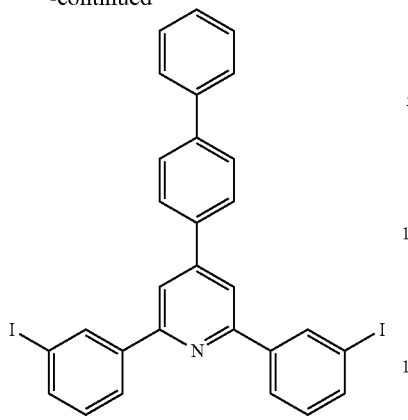

4-Phenyl benzaldehyde in an amount of 1.15 g (6.3 mmol), 3'-iodoacetophenone in an amount of 3.11 g (13 mmol), and ammonium acetate in an amount of 6.30 g (82 mmol) were dissolved in 16 mL of acetic acid and refluxed for 9 hours. After the completion of the reaction, the mixture was cooled to room temperature, and precipitated crystals were collected by filtration and the crystals were further washed with ethanol. The obtained crystals were recrystallized from dichloromethane/IPA to give 0.46 g (12%) of the title compound.

APCI TOF MS m/z=634

Synthesis of 2,6-di(3-iodophenyl)-4-phenylpyridine

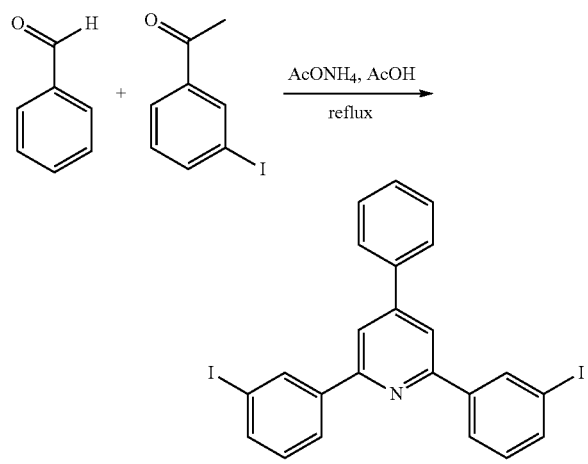

Benzaldehyde in an amount of 669 mg (6.3 mmol), 3'-iodoacetophenone in an amount of 3.11 g (12.6 mmol), and ammonium acetate in an amount of 6.30 g (81.7 mmol) were added to 15.9 mL of acetic acid and refluxed for 9 hours. The mixture was cooled to room temperature, and precipitated crystals were collected by filtration and the crystals were further washed with ethanol. The obtained crystals were recrystallized from dichloromethane/IPA to give 750 mg (21%) of the title compound.

APCI TOF MS m/z=558, 559

Synthesis of 1,3-dibromo-5-(carbazol-9-yl)-benzene

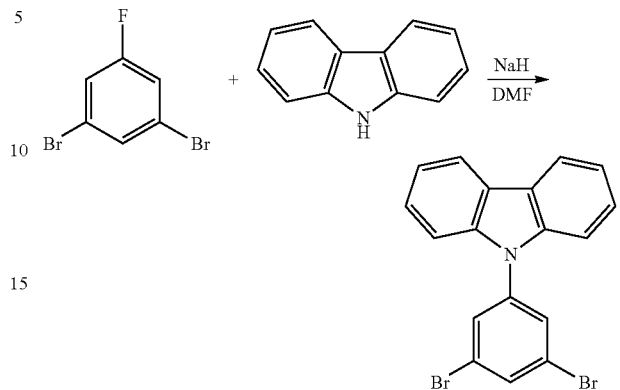

55% Sodium hydride in an amount of 500 mg (11.5 mmol) was suspended in 20 mL of DMF, carbazole in an amount of 1.67 g (10 mmol) was added, and the suspension was dissolved by heating to 80° C. Subsequently, 1,3-dibromo-5-fluorobenzene in an amount of 2.54 g (10 mmol) was added dropwise and stirred at 100° C. for 16 hours during heating. The reaction mixture was cooled to room temperature and quenched with ice water. The aqueous solution was extracted with dichloromethane. The resulting organic layer was concentrated under reduced pressure and dried over magnesium sulfate. The obtained residue was purified by column chromatography and recrystallized from heptane to give 1.63 g (41%) of the title compound.

APCI TOF MS m/z=402

Synthesis of 1,3-diiodo-5-(carbazol-9-yl)-benzene

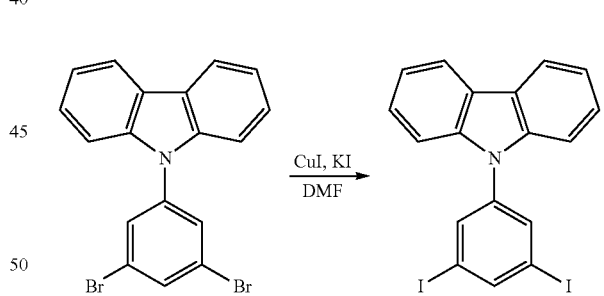

1,3-Dibromo-5-(carbazol-9-yl)-benzene in an amount of 360 mg (0.9 mmol), copper iodide (I) in an amount of 2.57 g (13.5 mmol), and potassium iodide in an amount of 5.57 g (33.6 mmol) were added to 10.6 mL of DMF and stirred during heating at 140° C. for 22 hours. After the completion of the reaction, insoluble matter was removed via Celite filtration. The filtrate was poured into water and extracted with dichloromethane. The resulting organic layer was dried over magnesium sulfate, and then, concentrated under reduced pressure. The obtained crystals were recrystallized from dichloromethane/methanol to give 380 mg (85%) of the title compound.

APCI TOF MS m/z=496

Synthesis of 1,3-dibromo-5-((3,6-di-tert-butyl)carbazol-9-yl)-benzene

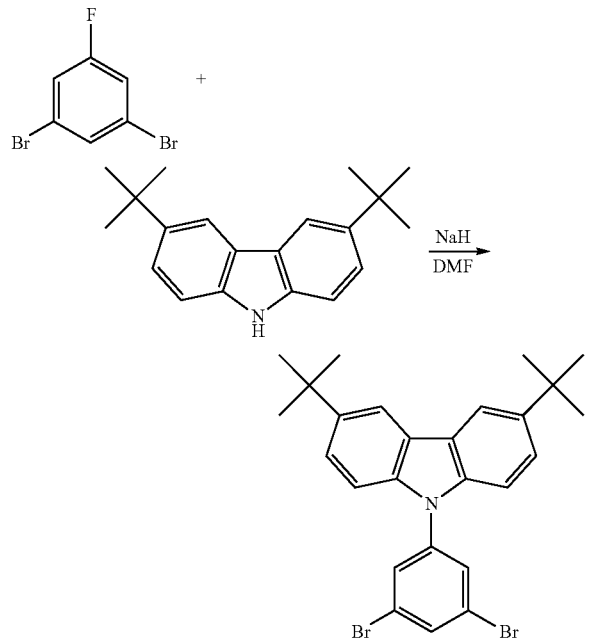

55% Sodium hydride in an amount of 400 mg (9.2 mmol) was suspended in 16 mL of DMF, and 3,6-di-tert-butylcarbazole in an amount of 2.24 g (8.0 mmol) was added. The suspension was dissolved during heating to 80° C. Subsequently, 1,3-dibromo-5-fluorobenzene in an amount of 2.03 g (8.0 mmol) was added dropwise and stirred at 100° C. for 16 hours. After the completion of the reaction, the mixture was poured into water and extracted with dichloromethane. The resulting organic layer was dried over magnesium sulfate and concentrated under reduced pressure. The obtained residue was purified by column chromatography, and the obtained solid was recrystallized from 2-propanol to give 2.25 g (55%) of the title compound.

APCI TOF MS m/z=514

Synthesis of 1,3-diiodo-5-(3,6-di-tert-butylcarbazol-9-yl)-benzene

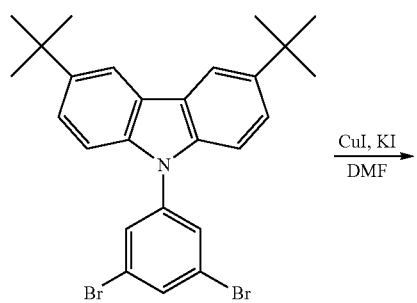

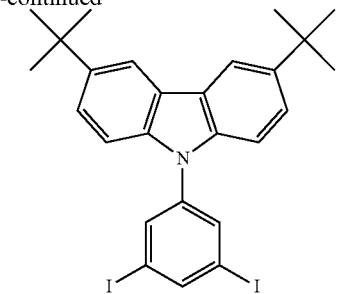

1,3-Dibromo-5-((3,6-di-tert-butyl)carbazol-9-yl)-benzene in an amount of 770 mg (1.5 mmol), copper iodide (I) in an amount of 4.29 g (22.5 mmol), and potassium iodide in an amount of 9.29 g (56 mmol) were added to 17.6 mL of DMF and stirred at 140° C. for 22 hours. After the completion of the reaction, insoluble matter was removed via Celite filtration. The filtrate was poured into water and extracted with dichloromethane. The resulting organic layer was dried over magnesium sulfate and concentrated under reduced pressure. The obtained crystals were recrystallized from dichloromethane/methanol to give 800 mg (87%) of the title compound.

APCI TOF MS m/z=608

Synthesis of 3,6-di-tert-butyl-9-(3,5-bis(4,4,5,5-tetramethyl-1,3,2-dioxaborolane-2-yl)phenyl)carbazole

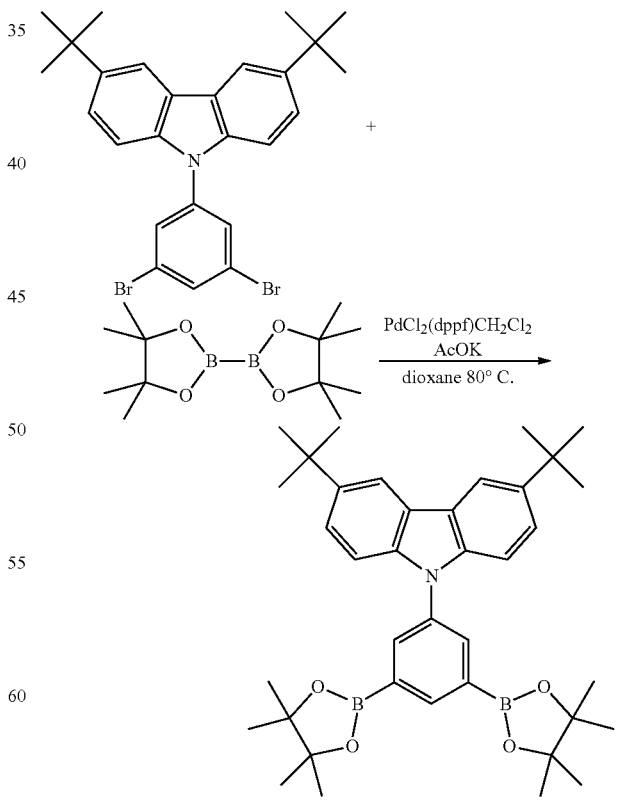

1,3-Dibromo-5-((3,6-di-tert-butyl)carbazol-9-yl)-benzene in an amount of 230 mg (0.45 mmol), bis(pinacolato)

diboron in an amount of 46 mg (1.8 mmol), and potassium acetate in an amount of 880 mg (9.0 mmol) were added to 5.4 mL of dioxane and stirred during heating at 60° C. for 15 minutes. Subsequently, PdCl$_2$(dppf)-CH$_2$Cl$_2$ in an amount of 20 mg (0.03 mmol) was added and stirred at 80° C. for 16 hours. After the completion of the reaction, the mixture was poured into water and extracted with dichloromethane. The resulting organic layer was dried over magnesium sulfate and concentrated under reduced pressure. The obtained residue was purified by column chromatography to give 210 mg (78%) of the title compound.
APCI TOF MS m/z=455

Synthesis of 5-bromoisophthalic Acid

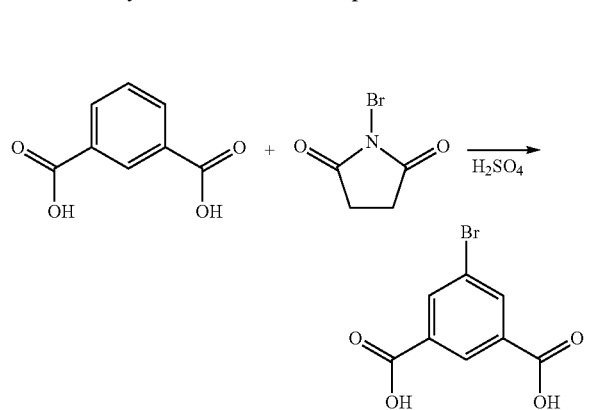

Isophthalic acid in an amount of 9.97 g (60 mmol) was added to 27 mL of concentrated sulfuric acid and heated to 60° C. Subsequently, NBS in an amount of 12.8 g (72 mmol) was added in three separate portions at 20-minute intervals and stirred overnight at room temperature. After the completion of the reaction, the mixture was poured into ice water and the resulting precipitate was collected by filtration. The precipitate was further washed with water and hexane and dried. The obtained solid was recrystallized from ethyl acetate to give 12.6 g (86%) of the title compound.
$^1$H NMR (DMSO) δ 8.44 (s, 1H), δ 8.26 (s, 2H)

Synthesis of 5-bromo-1,3-benzenedicarboxamide

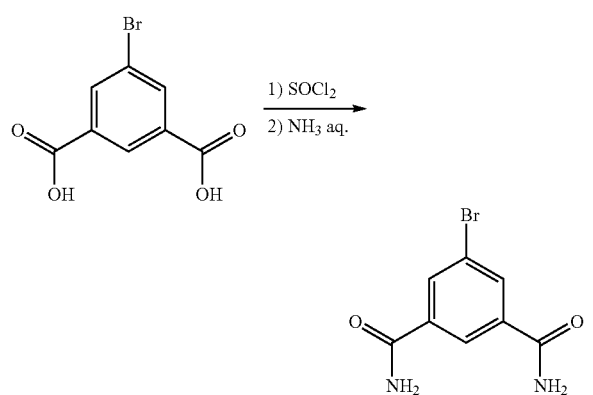

5-Bromoisophthalic acid in an amount of 610 mg (2.49 mmol) and 0.05 mL of DMF were added to 2.0 mL of toluene. Thionyl chloride in an amount of 0.45 mL (6.22 mmol) was added dropwise to the resulting solution over 10 minutes. After the completion of the dropwise addition, the mixture was refluxed for 3.5 hours. After the completion of the reaction, the mixture was cooled to 0° C., 5 mL of a 25% ammonia aqueous solution was added dropwise and stirred at 0° C. for 10 minutes and then at room temperature for 1 hour. The resulting precipitate was collected by filtration, and the precipitate was further washed with water. The obtained solid was recrystallized from acetic acid to give 376 mg (62%) of the title compound.
APCI-TOF-MS (m/z)=242, 244

Synthesis of 5-bromobenzene-1,3-dicarbonitrile

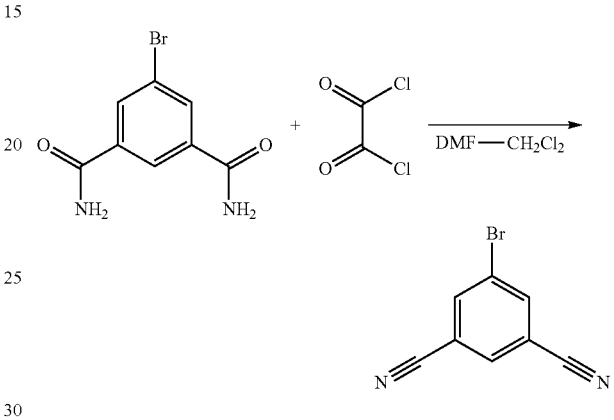

A 2M oxalyl chloride-dichloromethane solution in an amount of 43.9 mL (87.8 mmol) was added to 150 mL of DMF and cooled to 0° C. A solution of 5-bromo-1,3-benzenedicarboxamide in an amount of 7.55 g (31 mmol) and 150 mL of DMF was added dropwise and stirred at 0° C. for 6 hours. After the completion of the reaction, the mixture was diluted with ethyl acetate and washed with a saturated sodium hydrogen carbonate aqueous solution. The resulting organic layer was dried over magnesium sulfate and concentrated under reduced pressure. The obtained precipitate was recrystallized from ethanol to give 4.12 g (64%) of the title compound.
APCI-TOF-MS (m/z)=206, 208
$^1$H NMR (DMSO-d$_6$) δ 8.04 (s, 2H), δ 7.91 (s, 1H)

Synthesis of 2,8-dimethylphenoxaphosphine-10-oxide (DMPOPO)

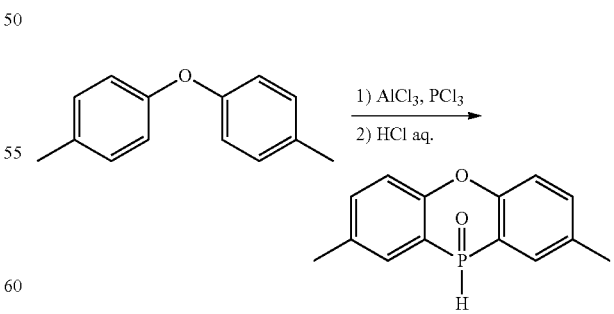

Aluminum chloride (III) in an amount of 5.07 g (38 mmol) was added in separate small portions to di-p-tolylether in an amount of 5.95 g (30 mmol) and phosphorus trichloride in an amount of 16.5 g (120 mmol) and refluxed for 8 hours. After the completion of the reaction, the reaction mixture was cooled to room temperature and concentrated under reduced pressure. The resulting residue was diluted with toluene and slowly added dropwise to ice-cooled dilute hydrochloric acid and stirred at room temperature for 1 hour. The aqueous layer was removed and the organic layer was neutralized with sodium bicarbonate aqueous solution. After Celite filtration, the obtained filtrate was poured into water and extracted with dichloromethane. The organic layer was concentrated under reduced pressure. The resulting residue was purified by column chromatography, and the resulting crystals were recrystallized from cyclohexane to give 4.63 g (63%) of the title compound.

APCI TOF MS m/z=245 [M+1]

$^1$H NMR (CDCl$_3$) δ 2.42 (s, 6H) 7.06-7.89 (m, 6H), 8.56 (d, 1H, $^1J_{HP}$=518 Hz)

Synthesis of phenoxaphosphine-10-oxide (POPO)

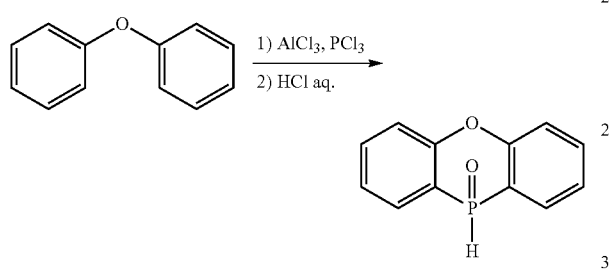

Aluminum chloride (III) in an amount of 2.39 g (17.9 mmol) was added in separate small portions to diphenylether in an amount of 2.35 g (13.8 mmol) and phosphorus trichloride in an amount of 11.4 g (83.0 mmol) and refluxed for 8 hours. After the completion of the reaction, the reaction mixture was cooled to room temperature and concentrated under reduced pressure. The resulting residue was diluted with toluene and slowly added dropwise to ice-cooled dilute hydrochloric acid and stirred at room temperature for 1 hour. The aqueous layer was removed and the organic layer was neutralized with sodium bicarbonate aqueous solution. After Celite filtration, the obtained filtrate was poured into water and extracted with dichloromethane. The organic layer was concentrated under reduced pressure. The resulting residue was purified by column chromatography. The obtained crystals were recrystallized from cyclohexane to give 0.30 g (10%) of the title compound APCI TOF MS m/z=217

Synthesis of 2,8-difluorophenoxaphosphine-10-oxide (DFPOPO)

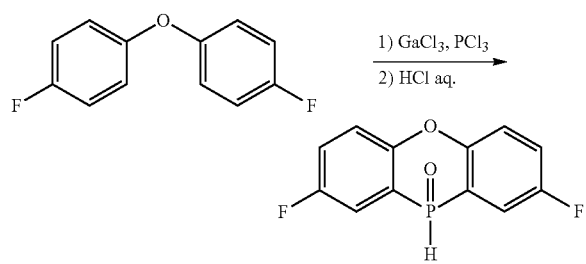

Gallium chloride (Ill) in an amount of 13.9 g (79 mmol) was added in separate small portions to bis(4-fluorophenyl) ether in an amount of 12.5 g (61 mmol) and phosphorus trichloride in an amount of 33.4 g (240 mmol) and refluxed for 8 hours. After the completion of the reaction, the reaction mixture was cooled to room temperature and concentrated under reduced pressure. The resulting residue was diluted with toluene and slowly added dropwise to ice-cooled dilute hydrochloric acid and stirred at room temperature for 1 hour. The aqueous layer was removed and the organic layer was neutralized with sodium bicarbonate aqueous solution. After Celite filtration, the obtained filtrate was poured into water and extracted with dichloromethane. The organic layer was concentrated under reduced pressure. The resulting residue was purified by column chromatography. The obtained crystals were recrystallized from cyclohexane to give 13.1 g (86%) of the title compound.

APCI TOF MS m/z=253

$^1$H NMR (CDCl$_3$) δ 6.91-7.84 (m, 6H, ArH), 8.61 (d, 1H, J=528 Hz)

Synthesis of 1-bromo-4-(2,8-difluorophenoxaphosphinoyl)benzene

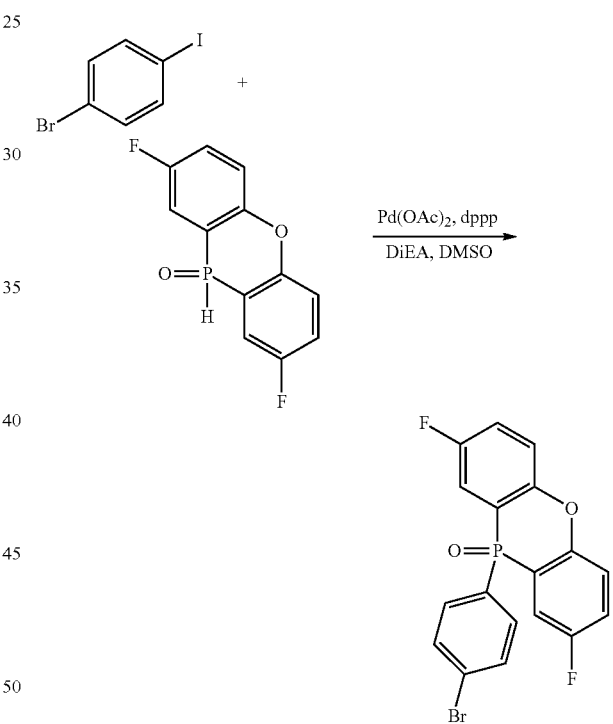

1-Bromo-4-iodobenzene in an amount of 3.39 g (12 mmol), 2,8-difluorophenoxaphosphineoxide in an amount of 1.51 g (6 mmol), palladium acetate in an amount of 70 mg (0.3 mmol), dppp in an amount of 0.25 g (0.6 mmol), and DIEA in an amount of 1.55 g (12 mmol) were added to 48 mL of DMSO and stirred at 80° C. for 4 hours. After the completion of the reaction, the mixture was poured into water and extracted with dichloromethane. The organic layer was dried over magnesium sulfate, and then, concentrated under reduced pressure. The resulting residue was purified by column chromatography. The obtained solid was recrystallized from dichloromethane/cyclohexane to give 1.22 g (50%) of the title compound.

APCI TOF MS m/z=408

Synthesis of bis(2-bromophenyl)sulfide

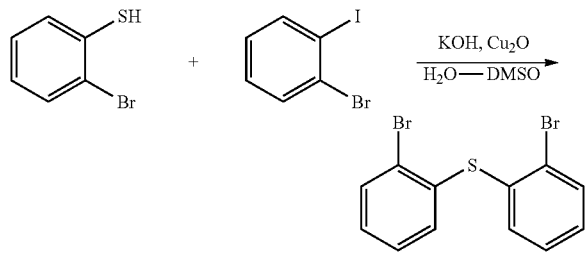

o-Bromobenzenethiol in an amount of 5.67 g (30 mmol), 1-bromo-2-iodobenzene in an amount of 8.49 g (30 mmol), potassium hydroxide in an amount of 3.37 g (60 mmol), and Cu$_2$O in an amount of 0.22 g (1.5 mmol), and 5.5 mL of water were added to DMSO in an amount of 21.8 mL and stirred at 80° C. for 18 hours. The mixture was poured into water and extracted with dichloromethane. The organic layer was dried over magnesium sulfate, and then, concentrated under reduced pressure. The obtained residue was purified by column chromatography to give 8.85 g (86%) of the title compound.

APCI TOF MS m/z=341, 343, 345

Synthesis of phenothiaphosphine-10-oxide(PTPO)

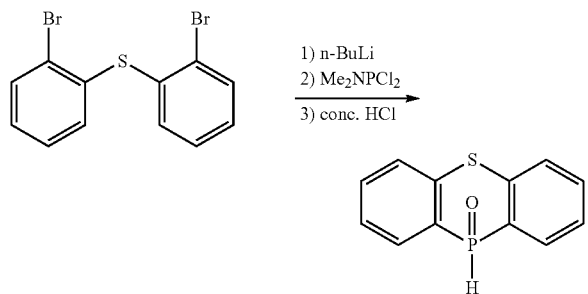

Bis(2-bromophenyl)sulfide in an amount of 2.00 g (5.80 mmol) was dissolved in 17.4 mL of THF and cooled to −80° C. A 1.6 Mn-BuLi-hexane solution in an amount of 8 mL (12.8 mmol) was added dropwise and stirred at −80° C. for 1.5 hours. Thereafter, a solution of dichloro(dimethylamino)phosphine in an amount of 1.06 g (6.10 mmol) and 5 mL of THF was added dropwise, stirred at −80° C. for 2 hours, and then slowly warmed to room temperature. Concentrated hydrochloric acid in an amount of 3.0 mL was added and stirred at room temperature for 1 hour. The reaction mixture was poured into water and extracted with dichloromethane. The organic layer was dried over magnesium sulfate, and then, concentrated under reduced pressure. The resulting residue was purified by column chromatography to give 0.65 g (48%) of the title compound.

APCI TOF MS m/z=233

$^1$H NMR (CDCl$_3$) δ 5.09 (s, 1H), 7.17-8.24 (m, 8H)

Synthesis of (2-carbomethoxyphenyl)diphenylphosphineoxide (TPPO-2-CO2Me)

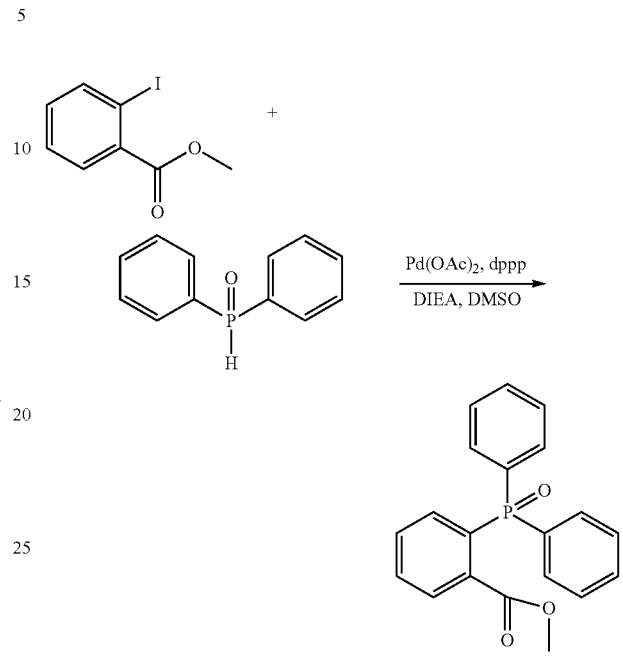

Methyl 2-iodobenzoate in an amount of 36.7 g (140 mmol), DPPO in an amount of 28.3 g (140 mmol), palladium acetate in an amount of 943 mg (4.2 mmol), dppp in an amount of 3.46 g (8.4 mmol), and 43.9 mL of DIEA were added to 280 mL of DMSO and stirred at 100° C. for 26 hours. The obtained reaction mixture was poured into a saturated ammonia chloride aqueous solution and extracted with dichloromethane. The resulting organic layer was washed again with a saturated ammonium chloride aqueous solution, dried over magnesium sulfate, and then, concentrated under reduced pressure. The resulting residue was recrystallized from toluene to give 12.3 g (26%) of the title compound.

APCI TOF MS m/z=337

$^1$H NMR (CDCl$_3$) δ 3.49 (s, 3H), 7.33-8.06 (m, 14H)

Synthesis of diphenyl(2-(2-hydroxypropane-2-yl)phenyl)phosphineoxide(TPPO-2-CMe2OH)

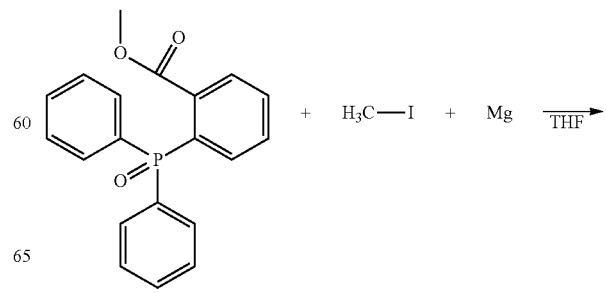

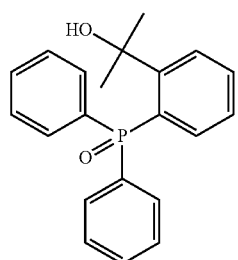

In an Ar atmosphere, a solution of iodomethane in an amount of 137 g (965 mmol) and 400 mL of diethyl ether solution was added dropwise to Mg in an amount of 19.5 g (804 mmol) during stirring with a mechanical stirrer over 30 minutes. After the completion of the dropwise addition, the mixture was stirred at room temperature for 30 minutes and then cooled in an ice bath. TPPO-2-CO2Me in an amount of 90.0 g (268 mmol) was added and stirred at 0° C. for 30 minutes and then at room temperature for 90 minutes. After the completion of the reaction, 100 mL of 1N hydrochloric acid was slowly added for quenching. The obtained solution was extracted with dichloromethane. The organic layer was further washed with 1N hydrochloric acid, water, and a saturated NaHCO$_3$ aqueous solution, dried over magnesium sulfate, and concentrated under reduced pressure. Thereafter, the obtained residue was recrystallized from toluene/heptane to give 57.2 g (63%) of the title compound.

MS m/z=337, 319

Synthesis of 10,10-dimethyl-5-phenylacridophosphine-5-oxide(Ph-DMAPO)

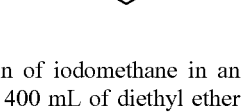

TPPO-2-CMe2OH in an amount of 63.7 g (189 mmol) was dispersed in 80 mL of polyphosphoric acid and stirred at 160° C. for 4 hours. After the completion of the reaction, 50 mL of water was added to dilute the reaction mixture. The diluted reaction mixture was poured into ice-cooled water for quenching and extracted with dichloromethane. The aqueous layer was extracted with ethyl acetate and added to the organic layer. The organic layer was washed with water, dried over magnesium sulfate, and concentrated under reduced pressure. The obtained residue was purified by column chromatography and recrystallized from ethyl acetate to give 28.9 g (48%) of the title compound.

APCI TOF MS m/z=319

$^1$H NMR (CDCl$_3$) δ 1.79 (s, 3H), 1.90 (s, 3H), 7.27-7.84 (m, 13H)

Synthesis of 10,10-dimethylacridophosphine-5-oxide(H-DMAPO)

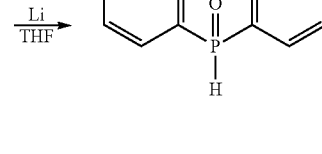

Ph-DMAPO in an amount of 28.7 g (90 mmol) was dissolved in 180 mL of THF, and Li in an amount of 1.52 g (219 mmol) was added and refluxed for 18 hours. After the completion of the reaction, water was carefully poured thereinto and a saturated ammonium chloride aqueous solution was added thereto, followed by extraction with dichloromethane. The organic layer was dried over magnesium sulfate, and then, concentrated under reduced pressure. The resulting residue was purified by column chromatography to give 10.5 g of a mixture containing a substance of interest. The obtained mixture was recrystallized from cyclohexane/dioxane to give 8.31 g (38%) of the title compound.

APCI TOF MS m/z=243

$^1$H NMR (CDCl$_3$) δ 1.86 (s, 6H), 7.41-8.40 (m, 8H), 11.02 (s, 1H)

Example 3: Synthesis of Triarylphosphine Oxides

Synthesis of 2,6-bis(4-(2,8-dimethylphenoxaphosphinoyl)phenyl)-4-(4-phenylphenyl)pyridine((DM-POPO-p-Ph)2 BP-Py)(I)

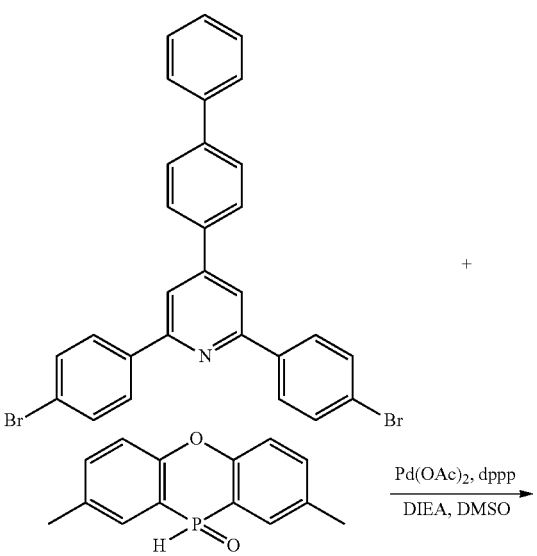

53

-continued

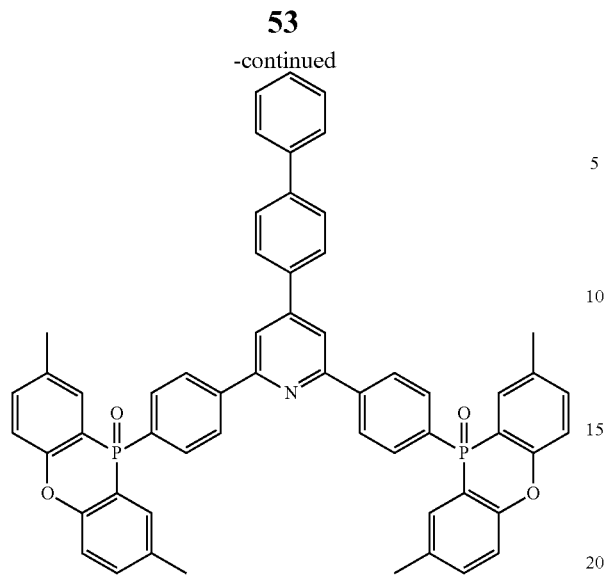

2,6-(4-Bromophenyl)-4-biphenylpyridine in an amount of 1.24 g (2.3 mmol), DMPOPO in an amount of 1.69 g (6.9 mmol), palladium acetate in an amount of 51.6 mg (0.23 mmol), dppp in an amount of 142 mg (0.345 mmol), and 7.65 mL of DIEA were added to 15.3 mL of DMSO and stirred at 100° C. for 26 hours. The obtained reaction mixture was poured into water and extracted with dichloromethane. The obtained organic layer was dried over magnesium sulfate, and then, concentrated under reduced pressure. The resulting residue was purified by column chromatography. The obtained solid was recrystallized from methanol/toluene to give 300 mg (15%) of the title compound.

APCI TOF MS m/z=867, 868

$^1$H NMR (CDCl$_3$) δ 2.31 (s, 12H, 7.10-8.25 (m, 31H)

54

-continued

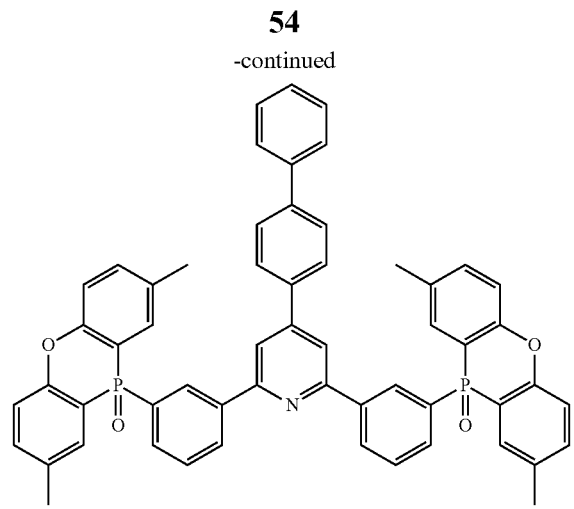

2,6-(3-Bromophenyl)-4-biphenylpyridine in an amount of 1.24 g (2.30 mmol), DMPOPO in an amount of 1.69 g (6.90 mmol), palladium acetate in an amount of 51.6 mg (0.230 mmol), dppp in an amount of 142 mg (0.345 mmol), and 7.65 mL of DIEA were added to 15.3 mL of DMSO and stirred at 100° C. for 26 hours. The obtained reaction mixture was poured into water and extracted with dichloromethane. The organic layer was dried over magnesium sulfate, and then, concentrated under reduced pressure. The resulting residue was purified by column chromatography. The obtained crystals were recrystallized from methanol/toluene to give 200 mg (10%) of the title compound.

APCI TOF MS m/z=867, 868

$^1$H NMR (CDCl$_3$) δ 2.31 (s, 12H), 7.20-8.76 (m, 31H)

Synthesis of 2,6-bis(3-(2,8-dimethylphenoxaphosphinoyl)phenyl)-4-(4-phenylphenyl)pyridine(DMPOPO-m-Ph)2 BP-Py(II)

Synthesis of 2,4-bis(4-(2,8-dimethylphenoxaphosphinoyl)phenyl)-6-phenyl-1,3,5-triaizine((DMPOPO-p-Ph)2Ph-TAZ)(III)

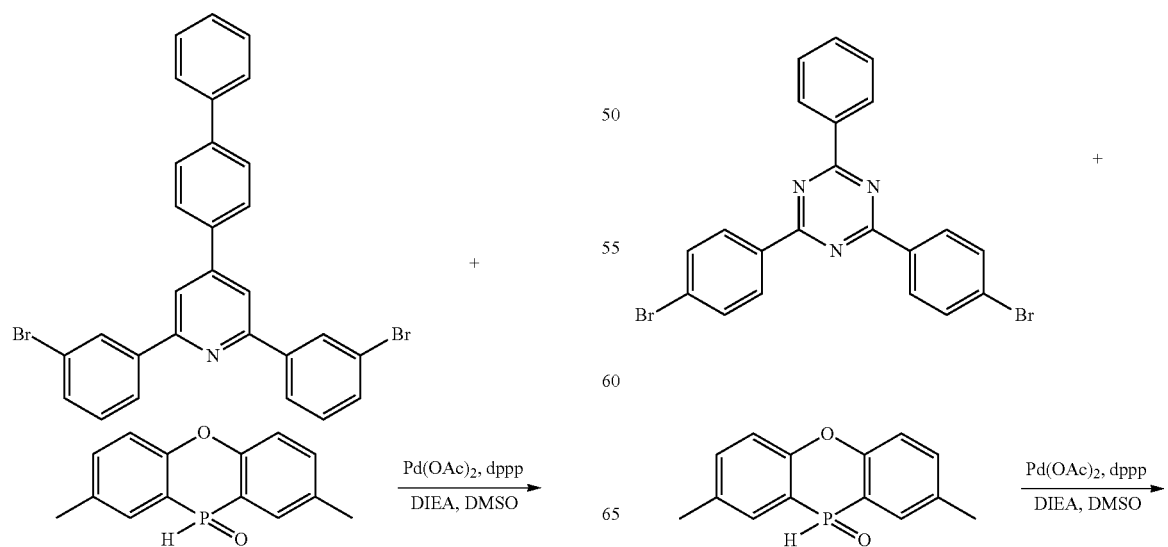

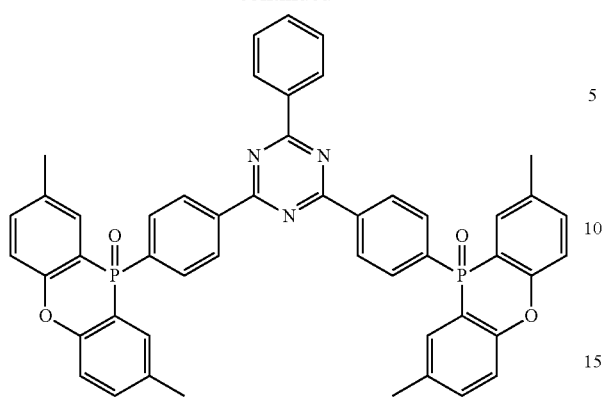

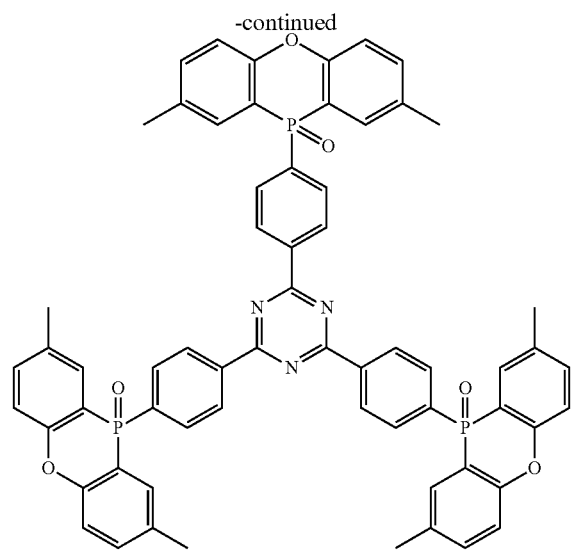

2,4-Bis(4-bromophenyl)-6-phenyl-1,3,5-triaizine in an amount of 1.07 g (2.3 mmol), DMPOPO in an amount of 1.69 g (6.9 mmol), palladium acetate in an amount of 52 mg (0.23 mmol), dppp in an amount of 142 mg (0.345 mmol), and 7.35 mL of DIEA were added to 15.3 mL of DMSO and stirred at 100° C. for 48 hours. The obtained reaction mixture was poured into water and extracted with dichloromethane. The organic layer was dried over magnesium sulfate, and then, concentrated under reduced pressure. The resulting residue was purified by column chromatography. The obtained crystals were recrystallized from methanol/toluene to give 800 mg (44%) of the title compound.

APCI TOF MS m/z=794

$^1$H NMR (CDCl$_3$) δ 2.32 (s, 12H), 7.12-8.01 (m, 19H), 8.66-8.85 (m, 6H)

Synthesis of 2,4,6-tris(4-(2,8-dimethylphenoxaphosphinoyl)phenyl)triazine((DMPOPO-p-Ph)3-TAZ) (IV)

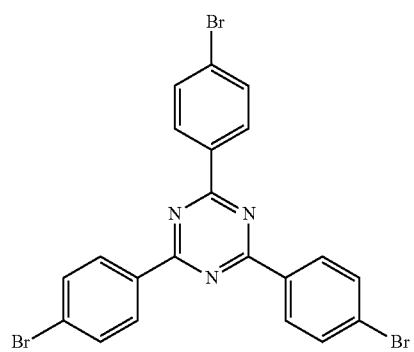

2,4,6-Tris(4-bromophenyl)-1,3,5-triaizine in an amount of 835 mg (1.53 mmol), 2,8-dimethylphenoxaphosphineoxide in an amount of 1.69 g (6.90 mmol), palladium acetate in an amount of 52 mg (0.230 mmol), dppp in an amount of 142 mg (0.345 mmol), and 7.35 mL of DIEA were added to 15.3 mL of DMSO and stirred at 100° C. for 48 hours. The obtained reaction mixture was poured into water and extracted with dichloromethane. The organic layer was dried over magnesium sulfate, and then, concentrated under reduced pressure. The resulting residue was purified by column chromatography. The obtained crystals were recrystallized from methanol/toluene to give 650 mg (41%) of the title compound.

APCI TOF MS m/z=1036

$^1$H NMR (CDCl$_3$) δ 2.31 (s, 18H), 7.12-8.00 (m, 24H), 8.63-8.81 (d, 6H)

Synthesis of 2,2',7,7'-tetrakis(2,8-dimethylphenoxaphosphinoyl)-9,9'-spirobifluorene(4DMPO-SPF)(V)

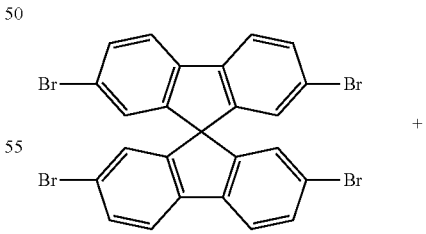

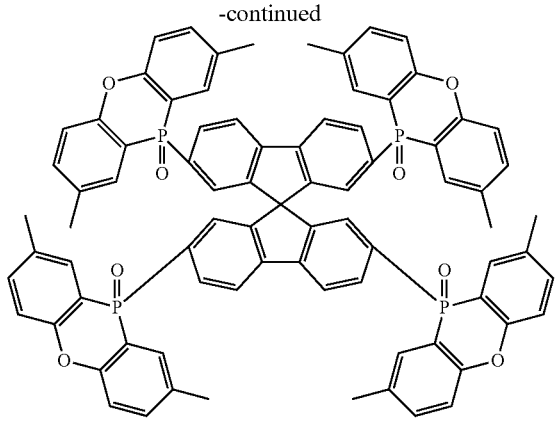

2,2',7,7'-Tetrabromo-9,9'-spirobifluorene in an amount of 683 mg (1.08 mmol), DMPOPO in an amount of 2.20 g (9.00 mmol), palladium acetate in an amount of 48 mg (0.216 mmol), and 18 mL of DIEA were added to 36 mL of DMSO and stirred at 100° C. for 60 hours. The obtained reaction mixture was poured into water and extracted with dichloromethane. The organic layer was dried over magnesium sulfate, and then, concentrated under reduced pressure. The resulting residue was purified by column chromatography. The obtained crystals were recrystallized from methanol/toluene to give 280 mg (20%) of the title compound.

APCI TOF MS m/z=1285

Synthesis of 2,7-bis(2,8-dimethylphenoxaphosphinoyl)-9,9-dimethylfluorene((BDMPOPO)2DMFlu) (VI)

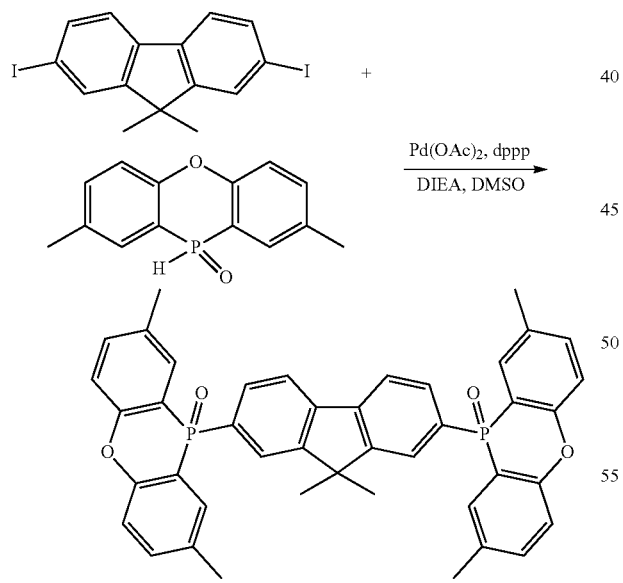

2,7-Diiodo-9,9-dimethylfluorene in an amount of 446 mg (1.0 mmol), DMPOPO in an amount of 586 mg (2.4 mmol), palladium acetate in an amount of 23 mg (0.10 mmol), dppp in an amount of 62 mg (0.15 mmol), and 3.3 mL of DIEA were added to 6.7 mL of DMSO and stirred at 100° C. for 48 hours. The reaction mixture was poured into water and extracted with dichloromethane. The organic layer was dried over magnesium sulfate, and then, concentrated under reduced pressure. The resulting residue was purified by column chromatography. The obtained crystals were recrystallized from methanol/toluene to give 350 mg (52%) of the title compound.

APCI TOF MS m/z=678

Synthesis of 2,7-bis(phenoxaphosphinoyl)-9,9-dimethylfluorene((DPOPO)2DMFlu)(VII)

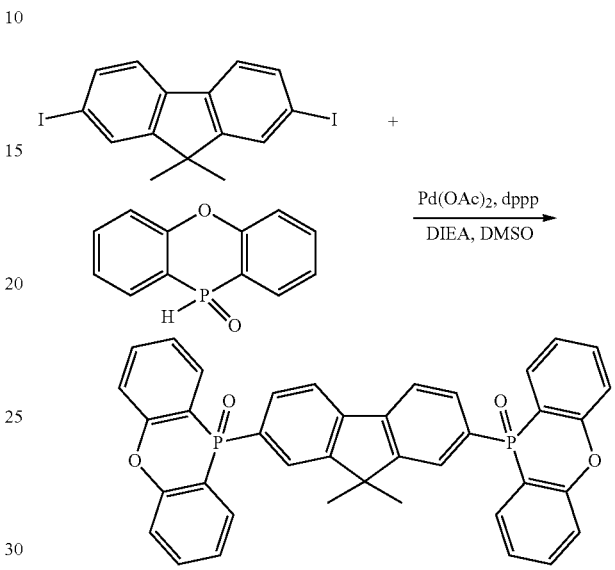

2,7-Diiodo-9,9-dimethylfluorene in an amount of 180 mg (0.40 mmol), POPO in an amount of 210 mg (0.97 mmol), palladium acetate in an amount of 9.1 mg (0.040 mmol), and 1.3 mL of DIEA were added to 2.7 mL of DMSO and stirred at 100° C. for 60 hours. The obtained reaction mixture was poured into water and extracted with dichloromethane. The organic layer was dried over magnesium sulfate, and then, concentrated under reduced pressure. The resulting residue was purified by column chromatography. The obtained crystals were recrystallized from toluene to give 120 mg (30%) of the title compound.

APCI TOF MS m/z=622

Synthesis of 2,6-bis(4-(2,8-difluorophenoxaphosphinoyl)phenyl)-4-(4-phenylphenyl)pyridine((DFPOPO-p-Ph)2B P-Py)(VIII)

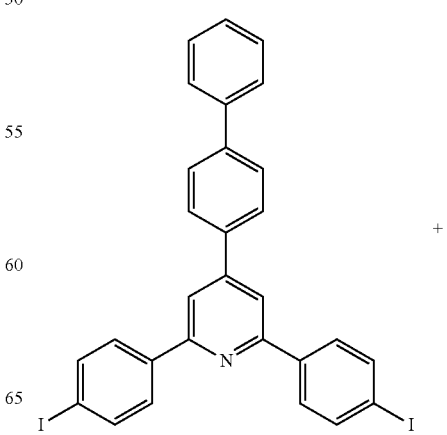

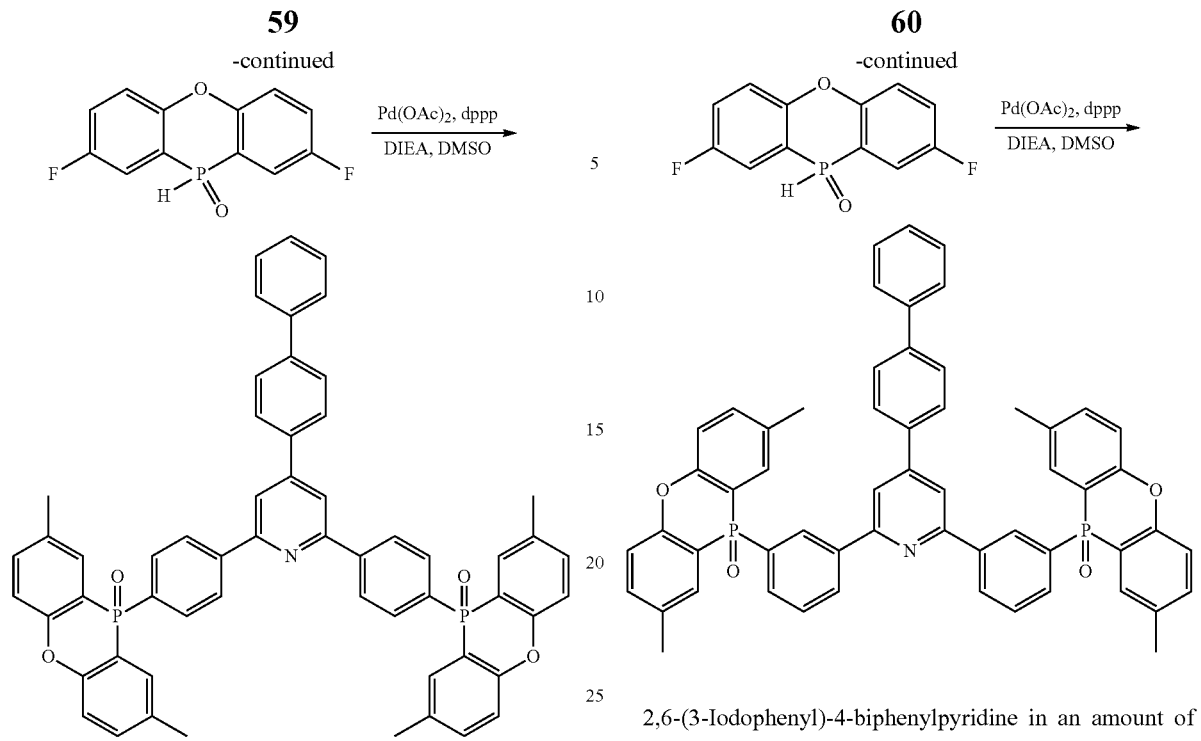

2,6-(4-Iodophenyl)-4-biphenylpyridine in an amount of 230 mg (0.362 mmol), DFPOPO in an amount of 274 mg (1.1 mmol), palladium acetate in an amount of 8.13 mg (0.036 mmol), dppp in an amount of 22.4 mg (0.054 mmol), and 1.2 mL of DIEA were added to 2.3 mL of DMSO and stirred at 100° C. for 48 hours. The obtained reaction mixture was poured into water and extracted with dichloromethane. The organic layer was dried over magnesium sulfate, and then, concentrated under reduced pressure. The resulting residue was purified by column chromatography. The resulting crystals were recrystallized from 2-propanol to give 102 mg (32%) of the title compound.

APCI TOF MS m/z=884

Synthesis of 2,6-bis(3-(2,8-difluorophenoxaphosphinoyl)phenyl)-4-(4-phenylphenyl)pyridine((DFPOPO-m-Ph)2B P-Py)(IX)

2,6-(3-Iodophenyl)-4-biphenylpyridine in an amount of 950 g (1.5 mmol), DFPOPO in an amount of 1.14 g (4.5 mmol), palladium acetate in an amount of 34.7 mg (0.15 mmol), dppp in an amount of 92.8 mg (0.23 mmol), and 4.8 mL of DIEA were added to 9.6 mL of DMSO and stirred at 100° C. for 48 hours. The obtained reaction mixture was poured into water and extracted with dichloromethane. The organic layer was dried over magnesium sulfate, and then, concentrated under reduced pressure. The resulting residue was purified by column chromatography. The obtained solid was recrystallized from IPA to give 410 mg (31%) of the title compound.

APCI TOF MS m/z=883, 884

Synthesis of 2,6-bis(3-(2,8-difluorophenoxaphosphinoyl)phenyl)-4-phenylpyridine((DFPOPO-m-Ph)2Ph-Py)(X)

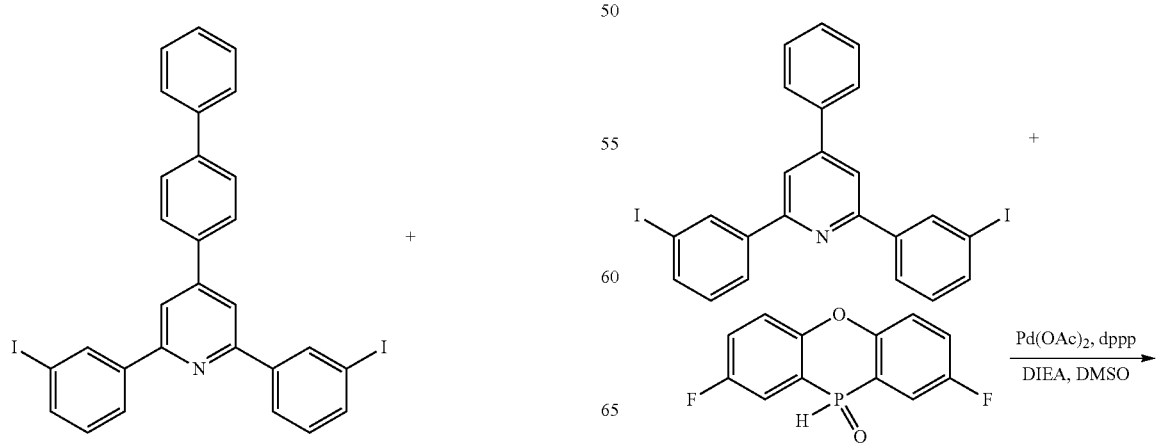

-continued

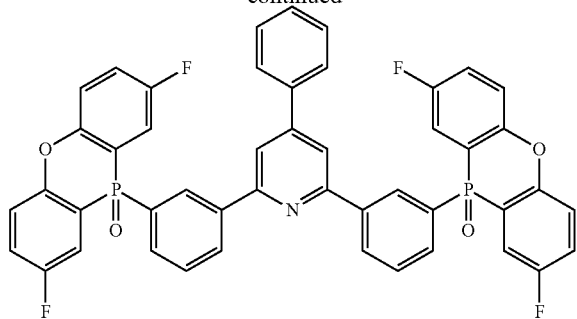

2,6-(3-Iodophenyl)-4-phenylpyridine in an amount of 369 mg (0.66 mmol), DFPOPO in an amount of 0.502 g (2.0 mmol), palladium acetate in an amount of 14.8 mg (0.066 mmol), dppp in an amount of 40.5 mg (0.098 mmol), and 2.1 mL of DIEA were added to 4.2 mL of DMSO and stirred at 100° C. for 48 hours. The obtained reaction mixture was poured into water and extracted with dichloromethane. The organic layer was dried over magnesium sulfate, and then, concentrated under reduced pressure. The resulting residue was purified by column chromatography. The obtained solid was recrystallized from toluene to give 255 mg (48%) of the title compound.

APCI TOF MS m/z=807

Synthesis of 2,4-bis(4-(2,8-difluorophenoxaphosphinoyl)phenyl)-6-phenylpyridine((DFPOPO-p-Ph)2Ph-TAZ)(XI)

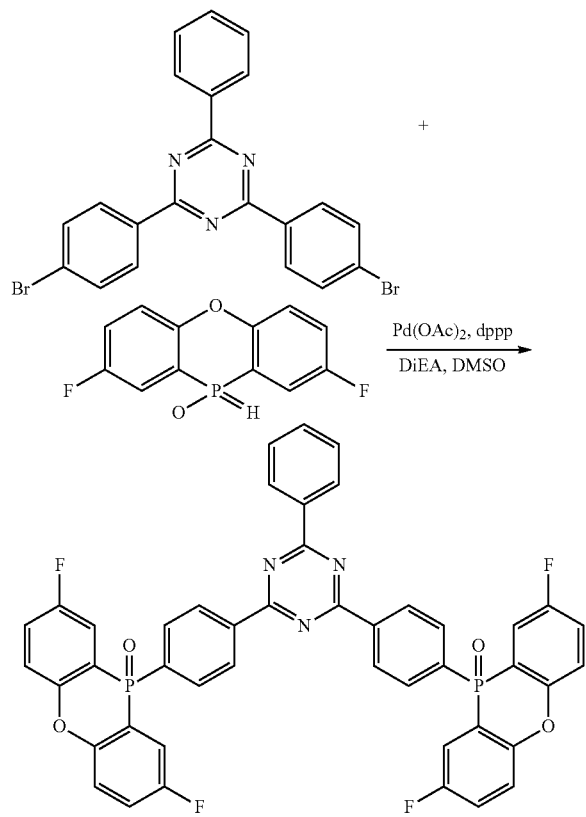

2,4-Bis(4-bromophenyl)-6-phenyl-1,3,5-triaizine in an amount of 989 mg (2.12 mmol), 2,8-difluoro-phenoxaphosphineoxide in an amount of 1.60 g (6.35 mmol), palladium acetate in an amount of 48 mg (0.212 mmol), dppp in an amount of 131 mg (0.317 mmol), and 7.3 mL of DIEA were added to 14.1 mL of DMSO and stirred at 100° C. for 60 hours. The obtained reaction mixture was poured into water and extracted with dichloromethane. The organic layer was dried over magnesium sulfate, and then, concentrated under reduced pressure. The resulting residue was purified by column chromatography. The obtained solid was recrystallized from toluene to give 104 mg (12%) of the title compound.

APCI TOF MS m/z=808

$^1$HNMR (CDCl$_3$) δ 7.20-7.99, 8.64-8.88 (m, 25H, ArH)

Synthesis of 2,7-bis(2,8-difluorophenoxaphosphinoyl)-9,9-dimethylfluorene((DFPOPO)2DMFlu) (XII)

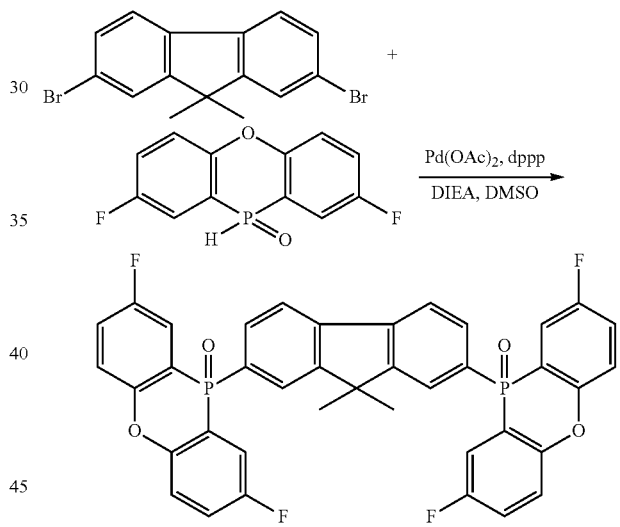

2,8-Difluorophenoxaphosphine-10-oxide in an amount of 920 mg (3.65 mmol), 2,7-dibromo-9,9-dimethylfluorene in an amount of 430 mg (1.22 mmol), palladium acetate in an amount of 27 mg (0.122 mmol), dppp in an amount of 76 mg (0.183 mmol), and 11.5 mL of DIEA were added to 23.9 mL of DMSO and stirred at 100° C. for 60 hours. The obtained reaction mixture was poured into water and extracted with dichloromethane. The organic layer was dried over magnesium sulfate, and then, concentrated under reduced pressure. The resulting residue was purified by column chromatography. The obtained solid was recrystallized from toluene to give 170 mg (20%) of the title compound.

APCI TOF MS m/z=694

$^1$H NMR (CDCl$_3$) δ 1.53 (s, 6H, CH3), 7.37-8.10 (m, 18H, ArH)

Synthesis of 3,5-bis(4-(2,8-difluorophenoxaphosphinoyl)phenyl)benzene(3,5-(DFPOPO-p-Ph)2BP) (XIII)

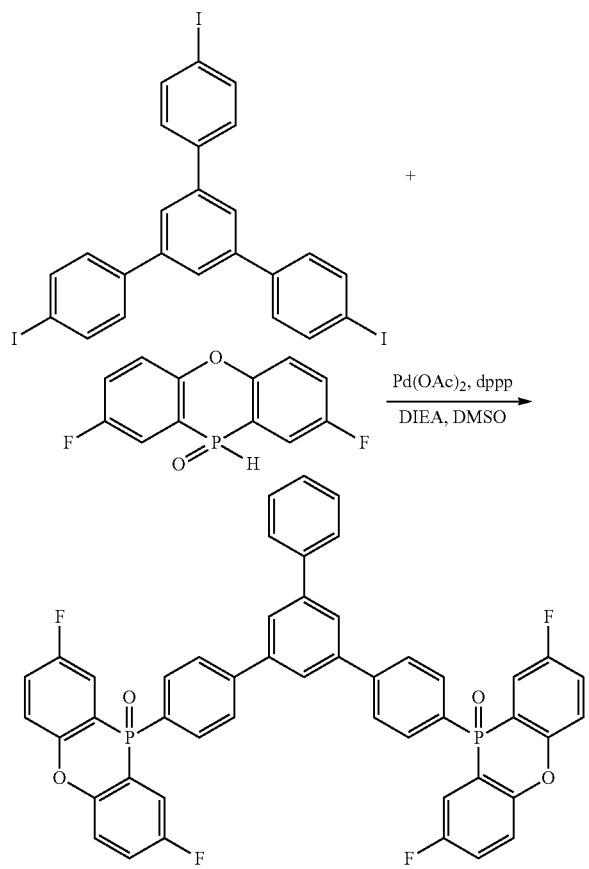

1,3,5-Tris(4-iodophenyl)benzene in an amount of 410 mg (0.600 mmol), DFPOPO in an amount of 908 mg (3.60 mmol), palladium acetate in an amount of 74.2 mg (0.180 mmol), dppp in an amount of 20.2 mg (0.090 mmol), and 1.0 mL of DIEA were added to 3.0 mL of DMSO and stirred at 100° C. for 48 hours. The obtained reaction mixture was poured into water and extracted with dichloromethane. The organic layer was dried over magnesium sulfate, and then, concentrated under reduced pressure. The resulting residue was purified by column chromatography. The obtained solid was recrystallized from toluene to give 155 mg (32%) of the title compound.

Synthesis of 2,2'-bis(2,8-difluorophenoxaphosphinoyl)-9,9'-spirobifluorene(DFPOPO)2SPF)(XIV)

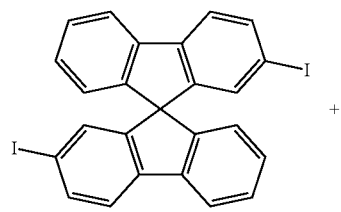

+

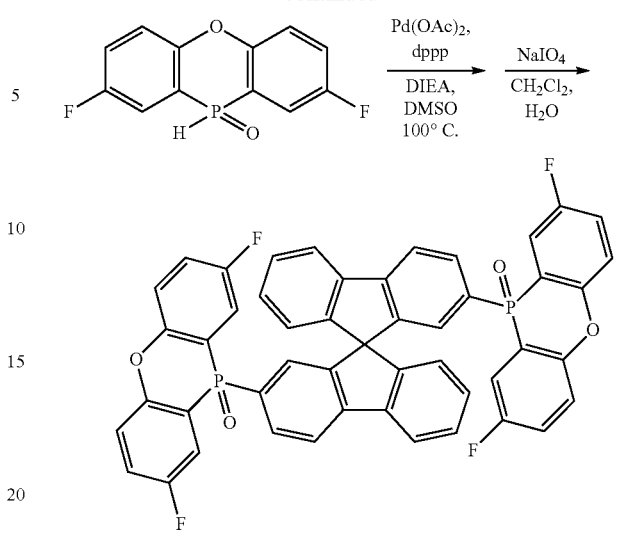

2,2'-Diiodo-9,9'-spirobifluorene in an amount of 568 mg (1.00 mmol), DFPOPO in an amount of 1.01 g (4.00 mmol), palladium acetate in an amount of 22.5 mg (0.100 mmol), dppp in an amount of 82.5 mg (0.200 mmol), and 2.0 mL of DIEA were added to 4.0 mL of DMSO and stirred at 100° C. for 48 hours. The obtained reaction mixture was poured into water and extracted with dichloromethane. The organic layer was dried over magnesium sulfate, and then, concentrated under reduced pressure. The obtained residue was dissolved in 5.0 mL of dichloromethane, 30% hydrogen peroxide in an amount of 110 mg (1.00 mmol) was added dropwise, and the resulting mixture was stirred overnight at room temperature. After the completion of the reaction, the mixture was poured into water and extracted with dichloromethane. The organic layer was washed with a saturated sodium hydrogen sulfite aqueous solution, dried over magnesium sulfate, and then, concentrated under reduced pressure. The resulting residue was purified by column chromatography. The obtained solid was recrystallized from toluene to give 302 mg (37%) of the title compound.

APCI TOF MS m/z=884

Synthesis of 1,3-bis(2,8-difluorophenoxaphosphinoyl)-5-(carbazol-9-yl)benzene(XV)

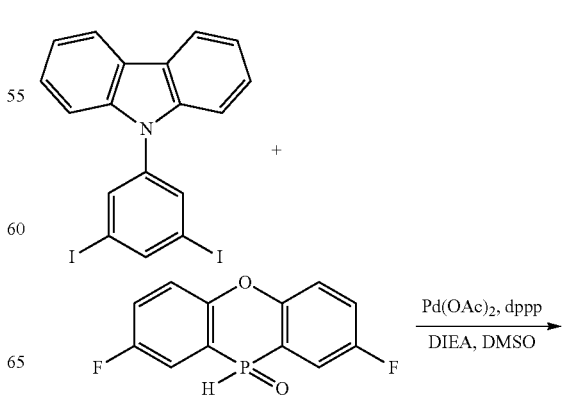

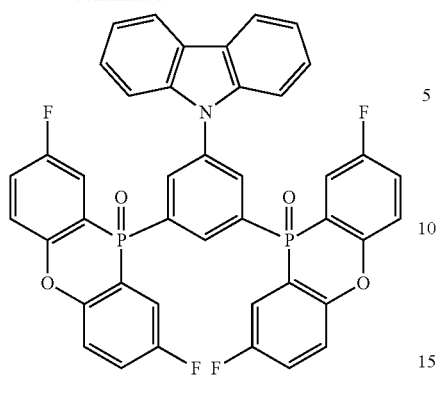
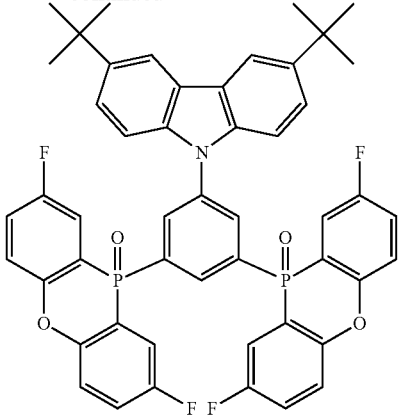

1,3-Diiodo-5-(carbazol-9-yl)-benzene in an amount of 550 mg (1.1 mmol), 2,8-difluorophenoxaphineoxide in an amount of 1.11 g (4.4 mmol), palladium acetate in an amount of 25 mg (0.11 mmol), dppp in an amount of 90 mg (0.22 mmol), and DIEA in an amount of 280 mg (2.2 mmol) were added to 4.4 mL of DMSO and heated at 100° C. for 1 hour. After the completion of the reaction, the mixture was poured into water and extracted with dichloromethane. The obtained organic layer was dried over magnesium sulfate and concentrated under reduced pressure. The resulting residue was purified by column chromatography. The obtained solid was recrystallized from dichloromethane/methanol to give 300 mg (37%) of the title compound.

APCI TOF MS m/z=743

1,3-Diiodo-5-(3,6-di-tert-butylcarbazol-9-yl)-benzene in an amount of 300 mg (0.5 mmol), 2,8-difluorophenoxaphosphineoxide in an amount of 450 mg (1.8 mmol), palladium acetate in an amount of 10 mg (0.05 mmol), dppp in an amount of 40 mg (0.1 mmol), and DIEA in an amount of 130 mg (1 mmol) were added to 2 mL of DMSO and stirred at 100° C. for 1 hour. After the completion of the reaction, the mixture was poured into water and extracted with dichloromethane. The organic layer was dried over magnesium sulfate and concentrated under reduced pressure. The resulting residue was purified by column chromatography. The obtained solid was recrystallized from dichloromethane/methanol. The obtained crystals were further purified by sublimation purification to give 250 mg (57%) of the title compound.

APCI TOF MS m/z=845

Synthesis of 5-(3,6-di-tert-butylcarbazol-9-yl)-3,5-bis(4-(2,8-difluorophenoxaphosphinoyl)phenyl)benzene(XVII)

Synthesis of 1,3-bis(2,8-difluorophenoxaphosphinoyl)-5-((3,6-di-tert-butyl)carbazol-9-yl)benzene (XVI)

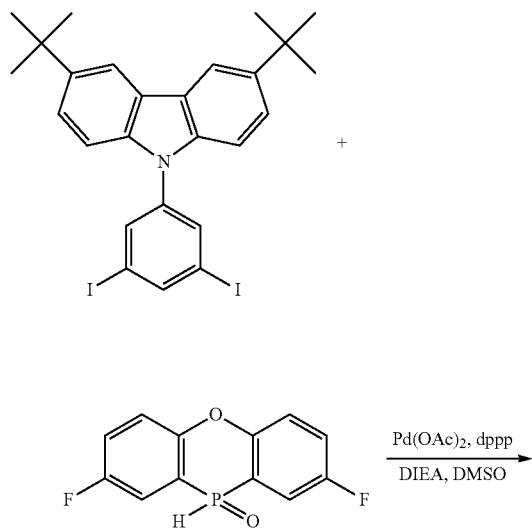

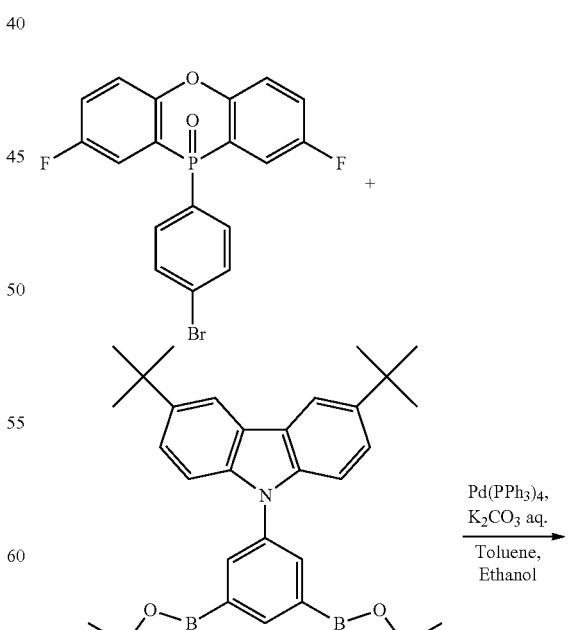

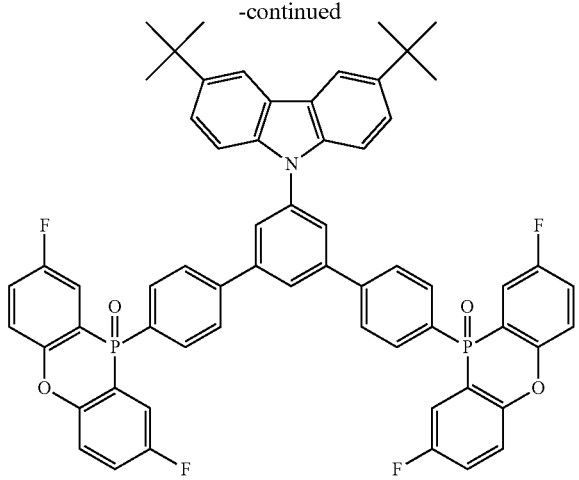

1-Bromo-4-(2,8-difluorophenoxaphosphinoyl)benzene in an amount of 400 mg (0.99 mmol), 3,6-di-tert-butyl-9-(3,5-bis(4,4,5,5-tetramethyl-1,3,2-dioxaborolane-2-yl)phenyl)carbazole in an amount of 200 mg (0.33 mmol), tetrakis(triphenylphosphine)palladium (0) in an amount of 20 mg (0.01 mmol), 0.83 mL of a 2M potassium carbonate aqueous solution, and 0.74 mL of ethanol were added to 1.1 mL of toluene and stirred at 80° C. for 3 hours. After the completion of the reaction, the mixture was poured into water and extracted with toluene. The organic layer was dried over magnesium sulfate and concentrated under reduced pressure. The resulting residue was purified by column chromatography. The obtained solid was recrystallized from dichloromethane/methanol to give 230 mg (69%) of the title compound.

APCI TOF MS m/z=1007

Synthesis of 2,7-bis(phenothiaphosphinoyl)-9,9-dimethylfluorene(DPTPO-DMFlu)(XVIII)

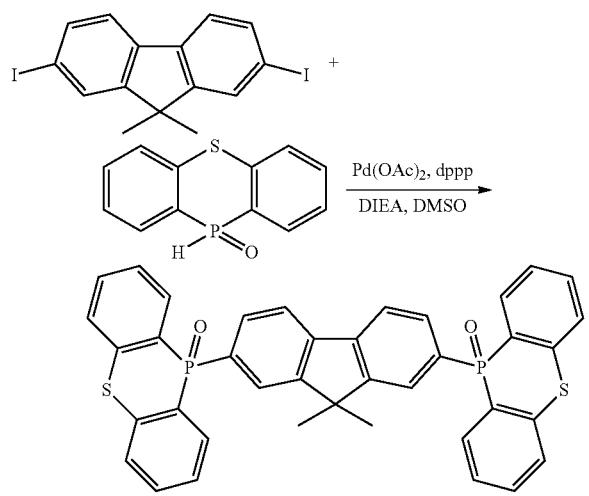

2,7-Diiodo-9,9-dimethylfluorene in an amount of 363 mg (0.814 mmol), PTPO in an amount of 460 mg (1.98 mmol), palladium acetate in an amount of 18 mg (0.081 mmol), dppp in an amount of 50 mg (0.122 mmol), and 2.6 mL of DIEA were added to 5.4 mL of DMSO and stirred at 100° C. for 48 hours. The obtained reaction mixture was poured into water and extracted with dichloromethane. The organic layer was dried over magnesium sulfate, and then, concentrated under reduced pressure. The resulting residue was purified by column chromatography. The obtained solid was recrystallized from toluene to give 107 mg (20%) of the title compound.

APCI TOF MS m/z=654

Synthesis of 2,2',7,7'-tetrakis(phenothiaphosphinoyl)-9,9-spirobifluorene((PTPO)4SPF)(XIX)

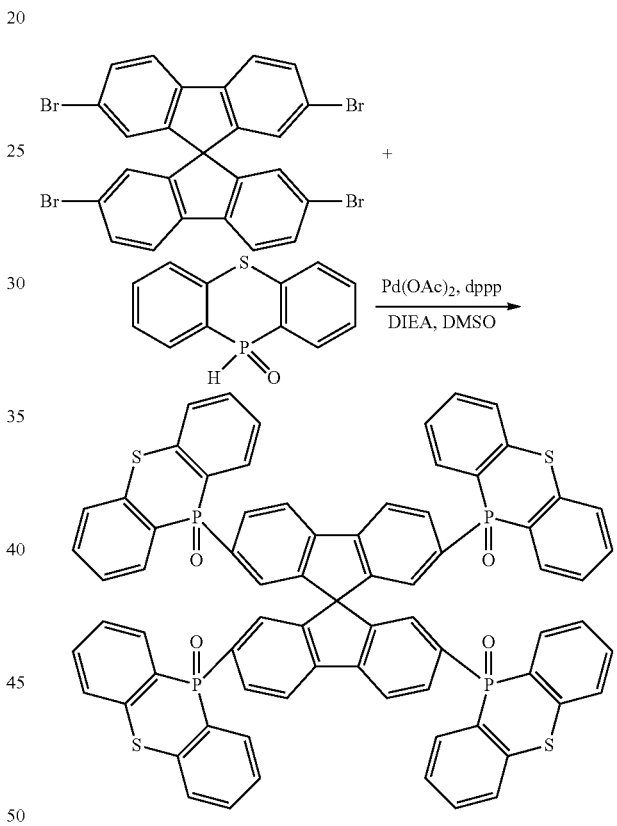

2,2',7,7'-Tetrabromo-9,9'-spirobifluorene in an amount of 210 mg (0.340 mmol), PTPO in an amount of 0.650 g (2.80 mmol), palladium acetate in an amount of 29.6 mg (0.132 mmol), dppp in an amount of 81.7 mg (0.198 mmol), and 2.2 mL of DIEA were added to 11.3 mL of DMSO and stirred at 100° C. for 60 hours. The obtained reaction mixture was poured into water and extracted with dichloromethane. The organic layer was dried over magnesium sulfate, and then, concentrated under reduced pressure. The resulting residue was purified by column chromatography. The obtained crystals were recrystallized from methanol/toluene to give 249 mg (59%) of the title compound.

APCI TOF MS m/z=1237

Synthesis of 2,7-bis(5,5-dioxophenothiaphosphinoyl)-9,9-dimethylfluorene(BPTPTO-DMFlu)(XX)

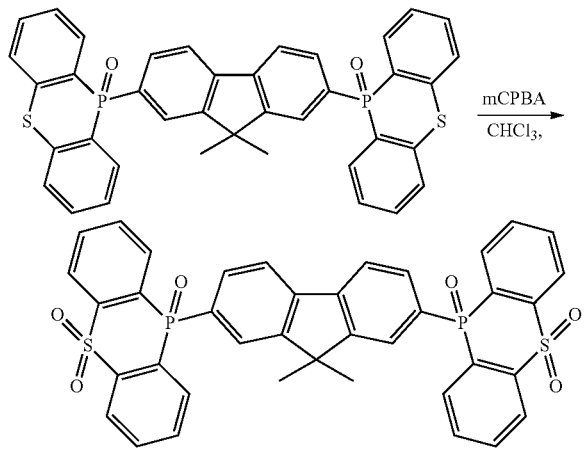

BPTPT-DMFlu in an amount of 100 mg (0.153 mmol) was dissolved in 2.4 mL of chloroform and cooled to 0° C. Subsequently, mCPBA in an amount of 137 mg (0.612 mmol) was added and stirred at room temperature for 6 hours. The reaction mixture was poured into water and extracted with dichloromethane. The organic layer was washed with a saturated sodium hydrogen sulfite aqueous solution and dried over magnesium sulfate, and then, concentrated under reduced pressure. The resulting residue was purified by column chromatography. The obtained solid was recrystallized from toluene to give 100 mg (91%) of the title compound.
APCI TOF MS m/z=718, 719
$^1$HNMR (CDCl$_3$) δ1.35 (s, 6H), 7.37-8.64 (m, 22H)

Synthesis of 2,7-bis(5-oxophenothiaphosphinoyl)-9,9-dimethylfluorene(BPTPDO-DMFlu)(XXI)

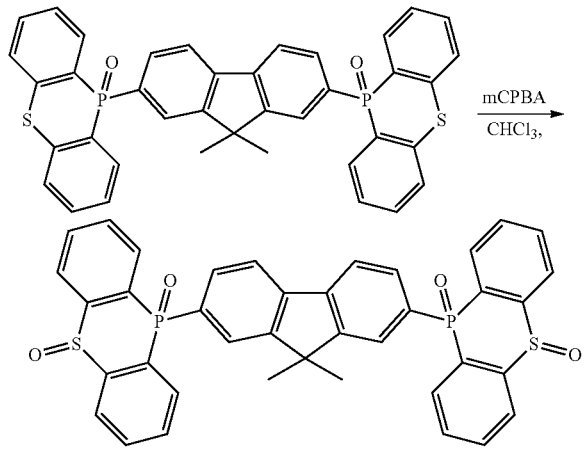

BPTPT-DMFlu in an amount of 400 mg (0.61 mmol) was dissolved in 9.6 mL of chloroform and cooled to 0° C. Subsequently, mCPBA in an amount of 274 mg (1.22 mmol) was added and stirred at room temperature for 3 hours. The reaction mixture was poured into water and extracted with dichloromethane. The organic layer was washed with a saturated sodium hydrogen sulfite aqueous solution and dried over magnesium sulfate, and then, concentrated under reduced pressure. The resulting residue was purified by column chromatography. The obtained solid was recrystallized from methanol/toluene to give 66 mg (16%) of the title compound.
APCI TOF MS m/z=686, 687

Synthesis of 2,4-bis(4-(10,10-dimethylacridophosphinoyl)phenyl)-6-phenyl-1,3,5-triaizine((DMAPO-p-Ph)2Ph-TAZ)(XXII)

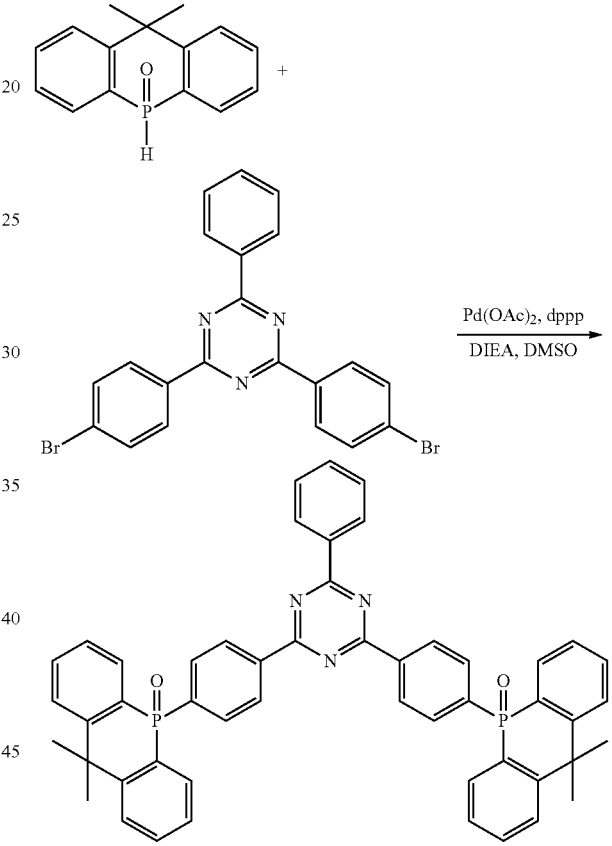

10,10-Dimethylacridophosphine-5-oxide in an amount of 472 mg (1.95 mmol), 2,4-bis (4-bromophenyl)-6-phenyl-1,3,5-triazine in an amount of 304 mg (0.65 mmol), palladium acetate in an amount of 29 mg (0.13 mmol), dppp in an amount of 107 mg (0.26 mmL), and 0.9 mL of diisopropylethylamine were dissolved in 2.6 mL of DMSO and stirred at 100° C. for 20 hours. After the completion of the reaction, the mixture was poured into a saturated ammonium chloride aqueous solution and extracted with dichloromethane. The organic layer was dried over magnesium sulfate and concentrated under reduced pressure. The resulting residue was purified by column chromatography to give 200 mg of a white solid. The obtained white solid was further recrystallized from toluene to give 153 mg (30%) of the title compound.
APCI TOF MS m/z=790

Example 3: Production and Evaluation of the Layered-Type Organic EL Element (Organic Electroluminescent Element)

1. Production of the Layered-Type Organic EL Element (Organic Electroluminescent Element)

A layered-type organic EL element (red phosphorescent element or green fluorescent element) with an area of 0.023 cm² was formed on a 150 nm ITO glass (50 mm square, GEOMATEC Co., Ltd.). The substrate was treated by ultrasonic cleaning with an alkali detergent (manufactured by Kanto Chemical Co., Inc.), ultrapure water, and acetone (manufactured by Wako Pure Chemical Industries, Ltd.) (each 5 minutes), washed by boiling (5 minutes) in 2-propanol (manufactured by Wako Pure Chemical Industries, Ltd.), and then, washed by UV/O$_3$ (15 minutes).

(1) Red Phosphorescent Element

The organic film of the hole injection layer was deposited by a spin coating method and the organic films of the hole transport layer, the light emitting layer, the hole blocking layer, and the electron transport layer were deposited by a vacuum vapor deposition method on ITO glass serving as a positive electrode. The material and film forming conditions of each layer are as follows. The ratio of a host material and a guest material of the doped light emitting layer was adjusted by monitoring using a quartz oscillator film thickness meter and adjusting the vapor deposition rate.

Hole injection layer: PEDOT-PSS (A14083 (manufactured by Heraeus)) (40 nm)
Spin coating: 2700 rpm×45 sec (air atmosphere)
Baking: 200° C., 60 min (air atmosphere)
Hole transport layer: α-NPD (N,N'-di(naphthalene-1-yl)-N,N'-diphenyl-benzidine: see the following) (40 nm)
Vapor deposition rate: 1 Å/sec, chamber pressure: <1×10⁻⁴ Pa
Light emitting layer (30 nm)
Host material: Organic electron transport material synthesized in Example 2
Luminescent material (guest material): Ir(piq)$_3$ (see the following), 6% by weight
Vapor deposition rate: 1 Å/sec, chamber pressure: <1×10⁻⁴ Pa
Hole blocking layer: BCP (2,9-dimethyl-4,7-diphenylphenanthroline: see the following) (10 nm)
Vapor deposition rate: 1 Å/sec, chamber pressure: <1×10⁻⁴ Pa
Electron transport layer: Alq$_3$ (tris(8-quinolinolato)aluminum: see the following) (30 nm)
Vapor deposition rate: 1 Å/sec, chamber pressure: <1×10⁻⁴ Pa (2) Green Fluorescent Element The organic films of the hole transport layer, the light emitting layer, and the electron transport layer were deposited by a vacuum vapor deposition method on ITO glass serving as a positive electrode. The material and film forming conditions of each layer are as follows. The ratio of a host material and a guest material of the doped electron transport layer was adjusted by monitoring using a quartz oscillator film thickness meter and adjusting the vapor deposition rate.

Hole transport layer: α-NPD (40 nm)
Vapor deposition rate: 1 Å/sec, chamber pressure: <1×10⁻⁴ Pa
Light emitting layer: Alq$_3$ (20 nm)
Vapor deposition rate: 1 Å/sec, chamber pressure: <1×10⁻⁴ Pa Electron transport layer: Organic electron transport material (30 nm) synthesized in Example 2

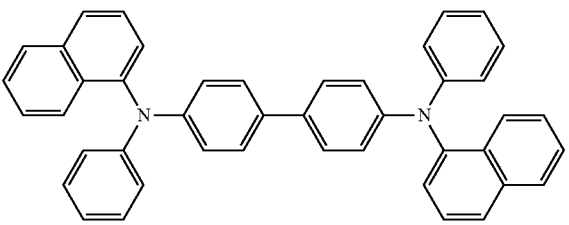

α—NPD

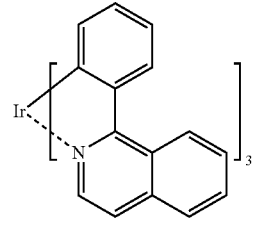

Ir(piq)$_3$

BCP

Alq$_3$

Liq

DPPO2DMF1u

A high vacuum vapor deposition apparatus with a chamber pressure of <1×10⁰·⁴ Pa was used for vapor deposition of the negative electrode (LiF/Al). The vapor deposition rate was set to 0.1 Å/s for LiF and 5 Å/s for Al. Sealing was carried out in an $N_2$ atmosphere for all elements. After the completion of deposition of the negative electrode, each element was immediately transferred to a glove box (manufactured by vac; moisture concentration: 1 ppm or less; oxygen concentration: 1 ppm or less) purged with nitrogen, and the element was sealed with a glass cap (manufactured by Climbing Co., Ltd.) to which a dry sheet material was attached (Dynic Corporation).

2. Measurement of the Lifetime of the Layered-Type Organic EL Element

The layered-type organic EL element was placed in a constant thermostatic bath at 25° C. for measurement of changes in brightness and voltage associated with constant current continuous driving by a lifetime measuring apparatus (manufactured by Kyushu Keisokki Co., Ltd.).

3. Results

Tables 2 and 3 list the measurement results. Table 2 lists the evaluation results of the organic electron transport materials (I) to (XXIII) for the red phosphorescent element. Table 3 lists the evaluation results of the organic electron transport materials (I) to (XXIII) for the green fluorescent element. Moreover, the results of the Comparative Examples using the DPPO2DMFlu as an organic electron transport material are also listed. As is understood from the tables below, the organic electron transport materials (I) to (XXIII) have long lifetime and excellent durability.

TABLE 2

| Host material | Half lifetime (relative value) |
|---|---|
| (DFPOPO-p-Ph)2BP-Py(VIII) | 63 |
| (DFPOPO-m-P)2BP-Py(IX) | 20 |
| (DFPOPO-m-Ph)2Ph-PY(X) | 8.4 |
| (BDMPOPO)2DMFlu(VI) | 1.3 |
| (DPOPO)2DMFlu(VII) | 1.5 |
| (DFPOPO)2DMFlu(XII) | 4.4 |
| (PTPO)4SUPF(XIX) | 13 |
| (DMAPO-p-Ph)2Ph-TAZ(XM) | 2.1 |
| (DMPOPO-p-Ph)2Ph-TAZ(III) | 1.2 |
| (DFPOPO-p-Ph)2Oh-TAZ(XI) | 107 |
| Comparative Example DPPO2DMFlu | 1 |

TABLE 3

| Organic electron transport material | Half lifetime (relative value) |
|---|---|
| DPOPO)2DMFlu(VII) | 1.66 |
| (VII) + Liq | 2950 |
| (DMPOPO-m-Ph)2 BP-Py(II) | 1.5 |
| (DMPOPO-p-Ph)2 BP-Py(I) | 5.3 |
| (DFPOPO-p-Ph)2BP-Py(VIII) | 475 |
| (DFPOPO-m-Ph)2BP-Py(IX) | 82 |
| (DFPOPO-m-PH)2Ph-Py(X) | 15 |
| (DMPOPO-P-Ph)2Ph-TAZ(III) | 10 |
| (III) + Liq | 421 |
| (DFPOPO-p-Ph)2Ph-TAZ(XI) | 6.7 |
| (DMAPO-p-Ph)2Ph-TAZ(XXII) | 15 |
| Comparative Example: DPPO2DMFlu | 1 |

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2015-257138, filed on Dec. 28, 2015, the entire disclosure of which is incorporated by reference herein.

REFERENCE SIGNS LIST

1 Organic EL element
2 Transparent substrate
3 Positive electrode
4 Hole transport layer
5 Light emitting layer
6 Electron transport layer
7 Negative electrode
8 Sealing member

The invention claimed is:

1. An organic electron transport material, which includes a compound represented by the following Formula (1):

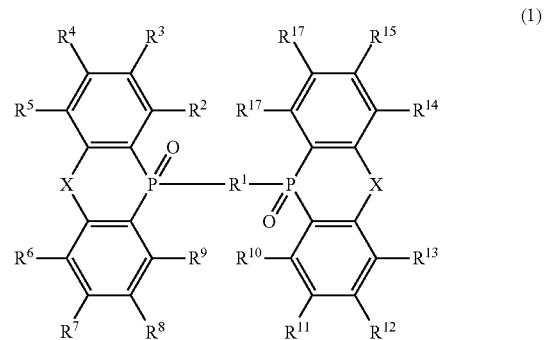

where, in Formula (1),
$R^1$ represents an atomic group which has either or both of one or more aryl groups and one or more heteroaryl groups,
$R^1$ includes, when $R^1$ does not have a heteroaryl group, interatomic bonds comprising carbon-carbon bonds that constitute two or less benzene rings, the interatomic bonds being obtained by tracing in Formula (1) from one P to another P such that interatomic bonds between the one P and the other P is shortest,
$R^1$ includes, when $R^1$ has a heteroaryl group, interatomic bonds comprising bonds that constitute a six-ring heterocycle, the interatomic bonds being obtained by tracing in Formula (1) from one P to another P such that interatomic bonds between the one P and the other P is shortest,
$R^2$ to $R^{17}$ each independently represent an atom or an atomic group selected from the group consisting of a hydrogen atom, a halogen atom, a cyano group, a $C_1$-$C_{12}$ linear or branched alkyl group, a linear or branched fluoroalkyl group, an aryl group, a substituted aryl group, a heteroaryl group, and a substituted heteroaryl group:
where, in Formula (1),
X represents an atom or an atomic group represented by any one of the following Formulae (2) to (7):

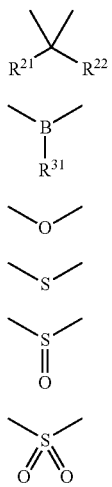

(2)
(3)
(4)
(5)
(6)
(7)

where, in Formula (2),
R$^{21}$ and R$^{22}$ each independently represent an atom or an atomic group selected from the group consisting of a hydrogen atom, a C$_1$-C$_{12}$ linear or branched alkyl group, a linear or branched fluoroalkyl group, an aryl group, a substituted aryl group, a heteroaryl group, and a substituted heteroaryl group, where, in Formula (3),
R$^{31}$ represents an atom or an atomic group selected from the group consisting of a hydrogen atom, a C$_1$-C$_{12}$ linear or branched alkyl group, a linear or branched fluoroalkyl group, an aryl group, a substituted aryl group, a heteroaryl group, and a substituted heteroaryl group.

2. An organic electroluminescent element, which comprises: a pair of electrodes composed of a positive electrode and a negative electrode; and a light emitting layer that is formed between the pair of electrodes so as to allow holes and electrons to be injected from the electrodes directly or via a different thin film layer and is electrically excited by recombination of holes and electrons injected from the electrodes so as to emit light, wherein the organic electroluminescent element contains a phosphine oxide derivative represented by the following Formula (1) and includes an electron transport layer that is disposed to be in contact with the negative electrode side of the light emitting layer:

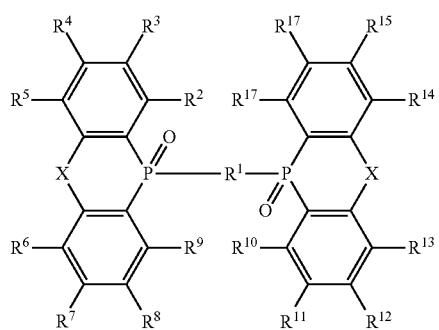

(1)

where, in Formula (1),
R$^1$ represents an atomic group which has either or both of one or more aryl groups and one or more heteroaryl groups, R$^1$ includes, when R$^1$ does not have a heteroaryl group, interatomic bonds comprising carbon-carbon bonds that constitute two or less benzene rings, the interatomic bonds being obtained by tracing in Formula (1) from one P to another P such that interatomic bonds between the one P and the other P is shortest, R$^1$ includes, when R$^1$ has a heteroaryl group, interatomic bonds comprising bonds that constitute a six-ring heterocycle, the interatomic bonds being obtained by tracing in Formula (1) from one P to another P such that interatomic bonds between the one P and the other P is shortest, R$^2$ to R$^{17}$ each independently represent an atom or an atomic group selected from the group consisting of a hydrogen atom, a halogen atom, a cyano group, a C$_1$-C$_{12}$ linear or branched alkyl group, a linear or branched fluoroalkyl group, an aryl group, a substituted aryl group, a heteroaryl group, and a substituted heteroaryl group:

where, in Formula (1),
X represents an atom or an atomic group represented by any one of the following Formulae (2) to (7):

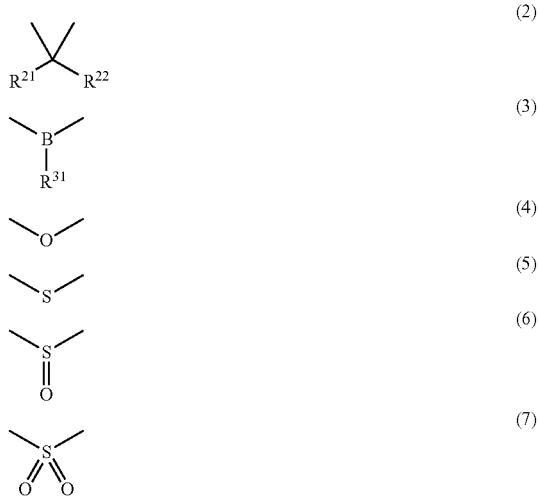

(2)
(3)
(4)
(5)
(6)
(7)

where, in Formula (2),
R$^{21}$ and R$^{22}$ each independently represent an atom or an atomic group selected from the group consisting of a hydrogen atom, a C$_1$-C$_{12}$ linear or branched alkyl group, a linear or branched fluoroalkyl group, an aryl group, a substituted aryl group, a heteroaryl group, and a substituted heteroaryl group, where, in Formula (3),
R$^{31}$ represents an atom or an atomic group selected from the group consisting of a hydrogen atom, a C$_1$-C$_{12}$ linear or branched alkyl group, a linear or branched fluoroalkyl group, an aryl group, a substituted aryl group, a heteroaryl group, and a substituted heteroaryl group.

3. An organic electroluminescent element, which comprises: a pair of electrodes composed of a positive electrode and a negative electrode; a compound that is formed between the pair of electrodes so as to allow holes and electrons to be injected from the electrodes directly or via a different thin film layer and is electrically excited by recombination of holes and electrons injected from the electrodes so as to emit light; and a light emitting layer that contains a phosphine oxide derivative represented by the following Formula (1):

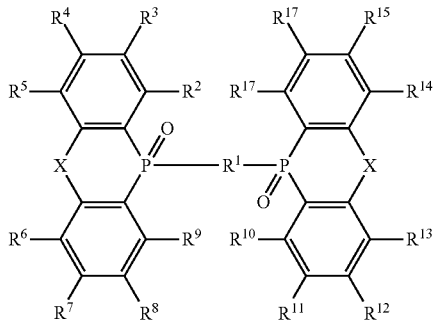
(1)

where, in Formula (1), $R^1$ represents an atomic group which has either or both of one or more aryl groups and one or more heteroaryl groups, $R^1$ includes, when $R^1$ does not have a heteroaryl group, interatomic bonds comprising carbon-carbon bonds that constitute two or less benzene rings, the interatomic bonds being obtained by tracing in Formula (1) from one P to another P such that interatomic bonds between the one P and the other P is shortest, $R^1$ includes, when $R^1$ has a heteroaryl group, interatomic bonds comprising bonds that constitute a six-ring heterocycle, the interatomic bonds being obtained by tracing in Formula (1) from one P to another P such that interatomic bonds between the one P and the other P is shortest, $R^2$ to $R^{17}$ each independently represent an atom or an atomic group selected from the group consisting of a hydrogen atom, a halogen atom, a cyano group, a $C_1$-$C_{12}$ linear or branched alkyl group, a linear or branched fluoroalkyl group, an aryl group, a substituted aryl group, a heteroaryl group, and a substituted heteroaryl group:

where, in Formula (1),

X represents an atom or an atomic group represented by any one of the following Formulae (2) to (7):

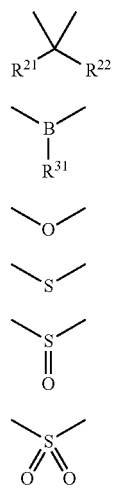

where, in Formula (2), $R^{21}$ and $R^{22}$ each independently represent an atom or an atomic group selected from the group consisting of a hydrogen atom, a $C_1$-$C_{12}$ linear or branched alkyl group, a linear or branched fluoroalkyl group, an aryl group, a substituted aryl group, a heteroaryl group, and a substituted heteroaryl group, where, in Formula (3), $R^{31}$ represents an atom or an atomic group selected from the group consisting of a hydrogen atom, a $C_1$-$C_{12}$ linear or branched alkyl group, a linear or branched fluoroalkyl group, an aryl group, a substituted aryl group, a heteroaryl group, and a substituted heteroaryl group.

* * * * *